(12) United States Patent
Fan et al.

(10) Patent No.: US 12,402,345 B2
(45) Date of Patent: Aug. 26, 2025

(54) SEMICONDUCTOR STRUCTURE AND METHOD FOR FORMING THE SAME

(71) Applicant: Taiwan Semiconductor Manufacturing Company, Ltd., Hsinchu (TW)

(72) Inventors: Yun-Ju Fan, Hsinchu (TW); Lin-Yu Huang, Hsinchu (TW); Sheng-Tsung Wang, Hsinchu (TW); Huan-Chieh Su, Changhua County (TW); Cheng-Chi Chuang, New Taipei (TW); Chih-Hao Wang, Baoshan Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 603 days.

(21) Appl. No.: 17/865,066

(22) Filed: Jul. 14, 2022

(65) Prior Publication Data

US 2024/0021711 A1    Jan. 18, 2024

(51) Int. Cl.
| | |
|---|---|
| H01L 29/66 | (2006.01) |
| H10D 30/01 | (2025.01) |
| H10D 30/62 | (2025.01) |
| H10D 62/13 | (2025.01) |
| H10D 64/01 | (2025.01) |
| H10D 64/62 | (2025.01) |

(52) U.S. Cl.
CPC ..... *H10D 30/0243* (2025.01); *H10D 30/6211* (2025.01); *H10D 30/6219* (2025.01); *H10D 62/151* (2025.01); *H10D 64/01* (2025.01); *H10D 64/62* (2025.01)

(58) Field of Classification Search
None
See application file for complete search history.

(56) References Cited

U.S. PATENT DOCUMENTS

2021/0391324 A1* 12/2021 Lu .................. H10D 84/0158
2022/0051949 A1*  2/2022 More ................. H10D 30/797

* cited by examiner

*Primary Examiner* — William C Trapanese
(74) *Attorney, Agent, or Firm* — Birch, Stewart, Kolasch & Birch, LLP

(57) ABSTRACT

A semiconductor structure is provided, and includes a first fin structure, a second fin structure, and a third fin structure over a substrate. The second fin structure is located between the first fin structure and the third fin structure. The semiconductor structure also includes a fin isolation structure formed between the first fin structure and the third fin structure; and a gate structure formed over the first fin structure, the second fin structure, the third fin structure and the fin isolation structure. The semiconductor structure further includes a plurality of epitaxial structures formed over the first fin structure, the second fin structure and the third fin structure. The semiconductor structure includes a dielectric material over the first epitaxial structure, the second epitaxial structure, and the third epitaxial structure; and a contact formed in the dielectric material and connected to the first epitaxial structure and the third epitaxial structure.

20 Claims, 21 Drawing Sheets

SEMICONDUCTOR STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from the substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
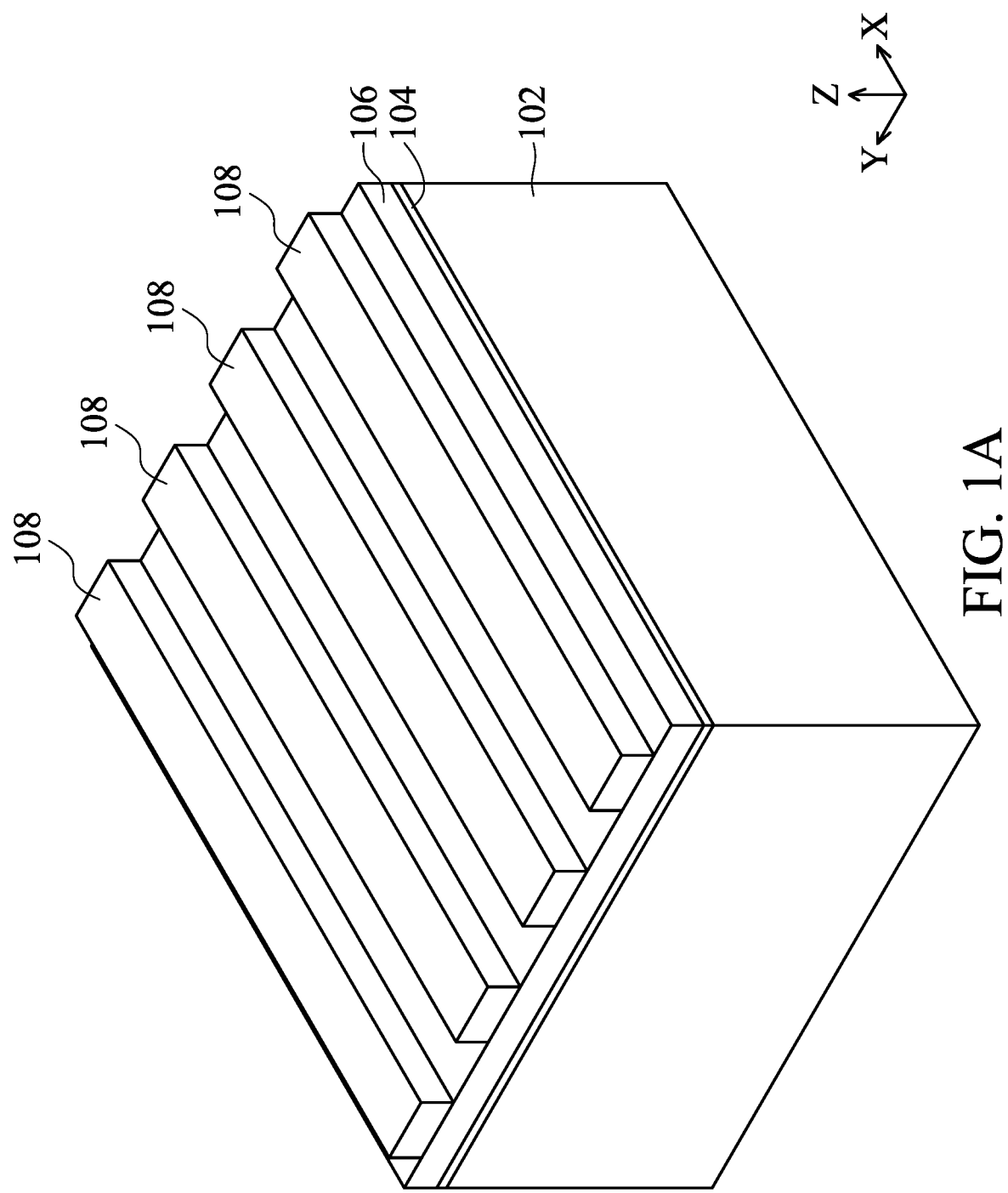
FIGS. 1A-1J are perspective views illustrating various stages of forming a semiconductor structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin structures described below may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Embodiments of semiconductor structures and methods for forming the same are provided. The semiconductor structure may include a contact formed in the single layer and connected to the non-adjacent epitaxial structures. Accordingly, it is more likely to achieve miniaturization (for example, reducing cell height), and increase the routing flexibility. In addition, the formation of the contact helps to keep the remaining structure from being removed by the etching processes since different processes and materials are adopted.

FIGS. 1A-1J are perspective views illustrating various stages of forming a semiconductor structure in accordance with some embodiments. A substrate 102 is provided, as shown in FIG. 1A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a patterned photoresist layer 108 is formed over the mask layer 106, as shown in FIG. 1A in accordance with some embodiments. The patterned photoresist layer 108 may be formed by a deposition process and a patterning process.

The deposition process for forming the patterned photoresist layer 108 may include a chemical vapor deposition (CVD) process, a high-density plasma chemical vapor deposition (HDPCVD) process, a spin-on process, a sputtering process, or another applicable process. The patterning process for forming the patterned photoresist layer 108 may include a photolithography process and an etching process. The photolithography process may include photoresist coating (e.g., spin-on coating), soft baking, mask aligning, exposure, post-exposure baking, developing the photoresist, rinsing, and drying (e.g., hard baking). The etching process may include a dry etching process or a wet etching process.

Moreover, the dielectric layer 104 may be a buffer layer between the substrate 102 and the mask layer 106. In some embodiments, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 may be formed by deposition processes, which may include a chemical vapor deposition (CVD) process, a high-density plasma chemical vapor deposition (HDPCVD) process, a spin-on process, a sputtering process, or another applicable process.

Figure 1B:
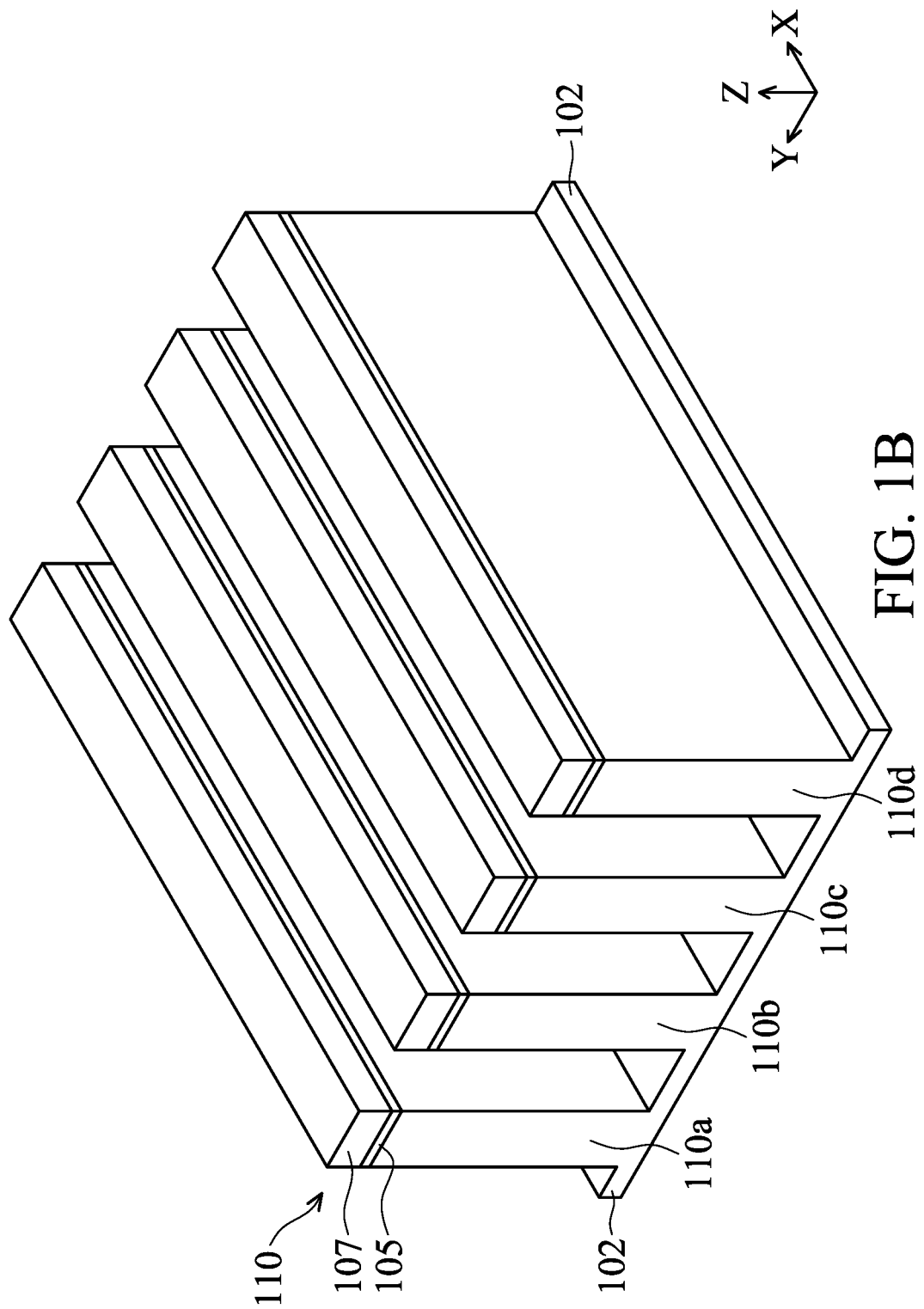

After the patterned photoresist layer 108 is formed, the dielectric layer 104 and the mask layer 106 are patterned by using the patterned photoresist layer 108 as a mask, as shown in FIG. 1B in accordance with some embodiments. As a result, a patterned dielectric layer 105 and a patterned mask layer 107 are obtained. Afterwards, the patterned photoresist layer 108 is removed.

Next, an etching process is performed on the substrate 102 to form a plurality of fin structures (for example, including a first fin structure 110a, a second fin structure 110b, a third fin structure 110c, a fourth fin structure 110d, which may be collectively referred to as the fin structures 110a, 110b, 110c, and 110d) by using the patterned dielectric layer 105 and the patterned mask layer 107 as a mask. The etching process may be a dry etching process or a wet etching process.

In some embodiments, the substrate 102 is etched by a dry etching process. The dry etching process includes using a fluorine-based etchant gas, such as $SF_6$, $C_xF_y$, $NF_3$ or a combination thereof. The etching process may be a time-controlled process, and continue until the fin structures 110a, 110b, 110c, and 110d reach a predetermined height. In some other embodiments, the fin structures 110a, 110b, 110c, and 110d have a width that gradually increases from the top portion to the lower portion.

Figure 1C:
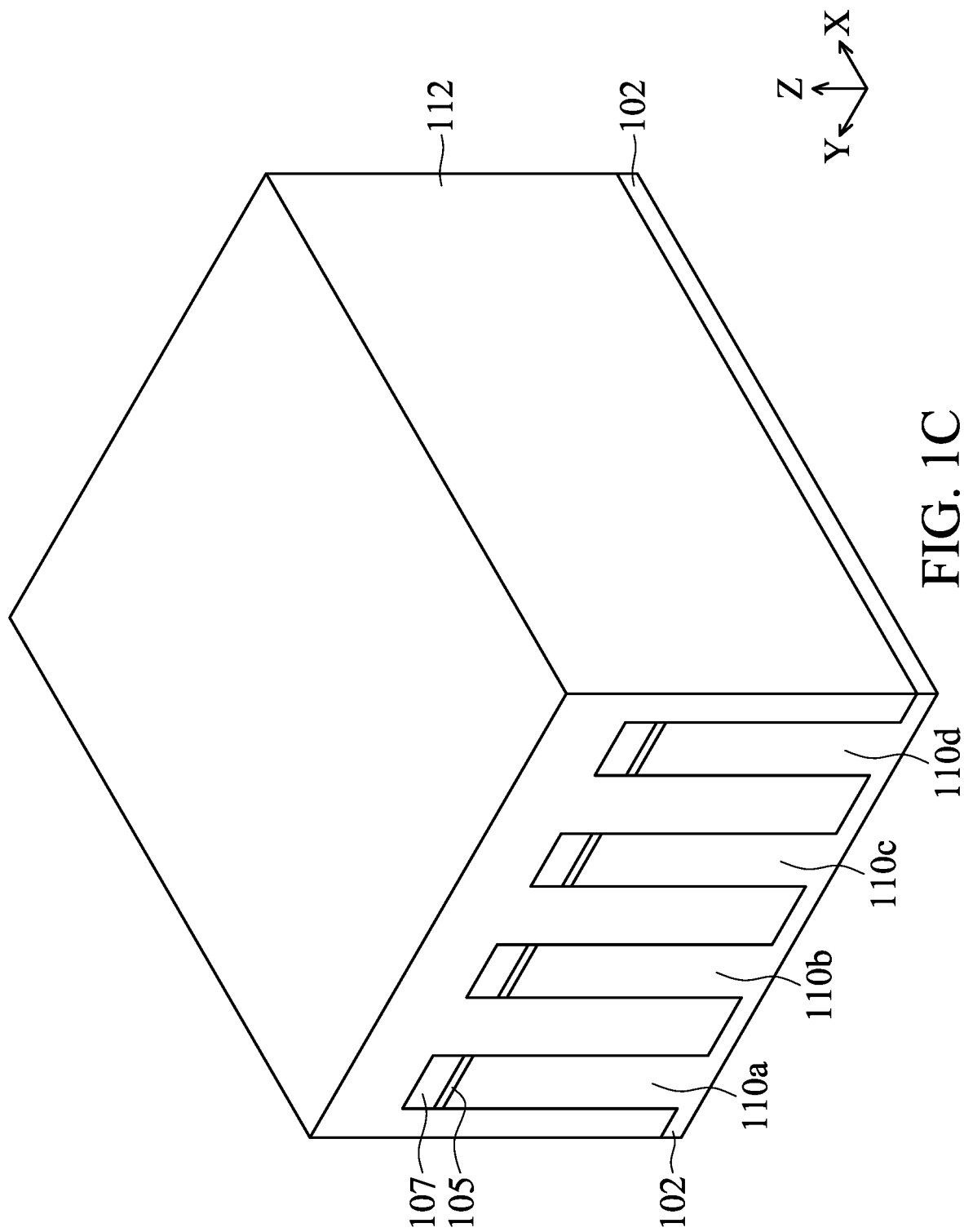

After the fin structures 110a, 110b, 110c, and 110d are formed, an insulating layer 112 is formed to cover the fin structures 110a, 110b, 110c, and 110d, the patterned pad layer 105, and the patterned mask layer 107 over the substrate 102, as shown in FIG. 1C in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited using a chemical vapor deposition (CVD) process, a spin-on-glass process, or another applicable process.

Next, the insulating layer 112 is thinned or planarized to expose the top surface of the patterned mask layer 107. In some embodiments, the insulating layer 112 is thinned by a chemical mechanical polishing (CMP) process. Afterwards, the patterned dielectric layer 105 and the patterned mask layer 107 are removed.

Figure 1D:
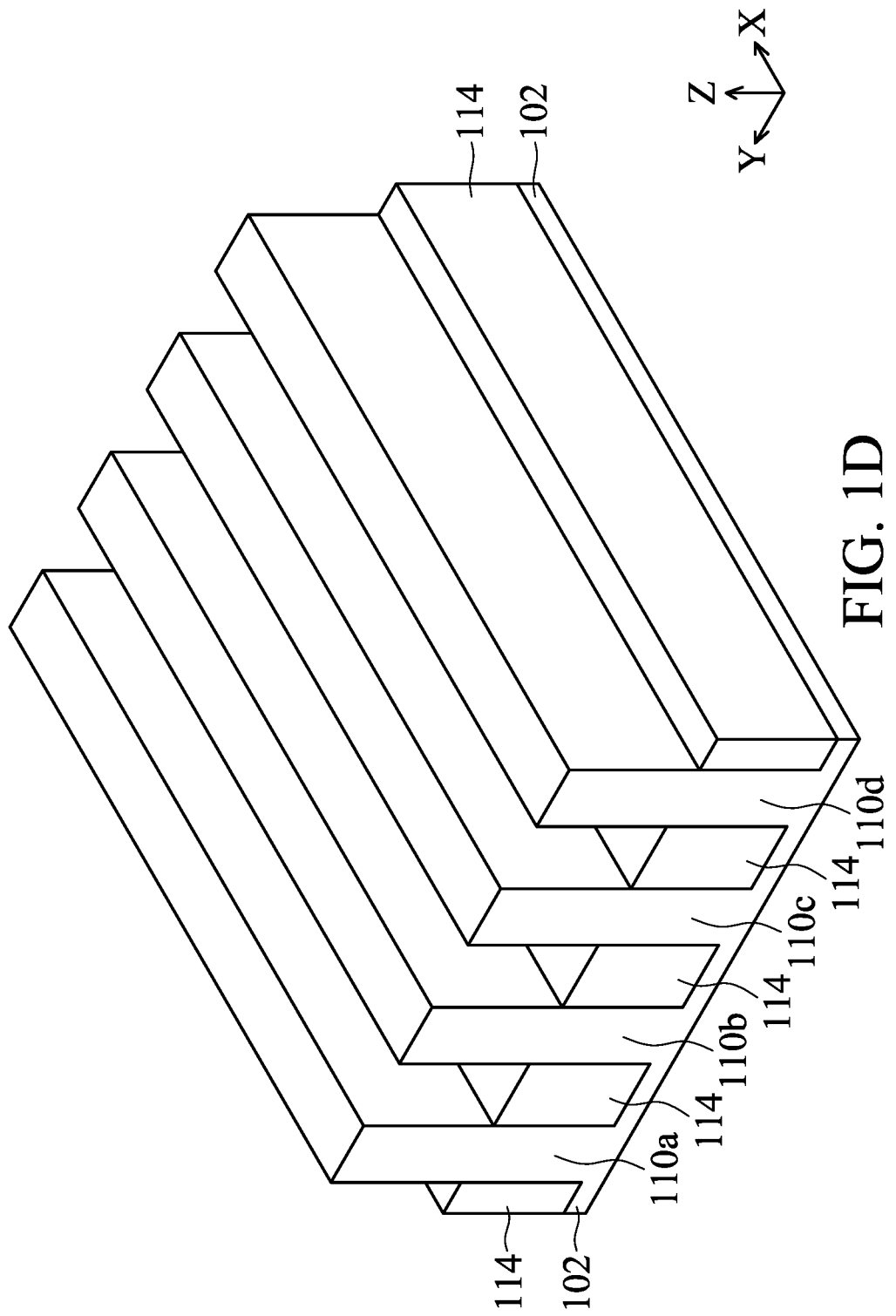

After the patterned dielectric layer 105 and the patterned mask layer 107 are removed, an upper portion of the insulating layer 112 is removed to form an isolation structure 114, as shown in FIG. 1D in accordance with some embodiments. The isolation structure 114 may be a shallow trench isolation (STI) structure surrounding the fin structures 110a, 110b, 110c, and 110d. That is to say, the isolation structure 114 is located between any adjacent two of the fin structures 110a, 110b, 110c, and 110d.

In some embodiments, a portion of the fin structures 110a, 110b, 110c, and 110d is embedded in the isolation structure 114. More specifically, a lower portion of the fin structures 110a, 110b, 110c, and 110d is surrounded by the isolation structure 114, while an upper portion of the fin structures 110a, 110b, 110c, and 110d protrudes from the isolation structure 114. The isolation structure 114 is configured to prevent electrical interference or crosstalk.

Figure 1E:
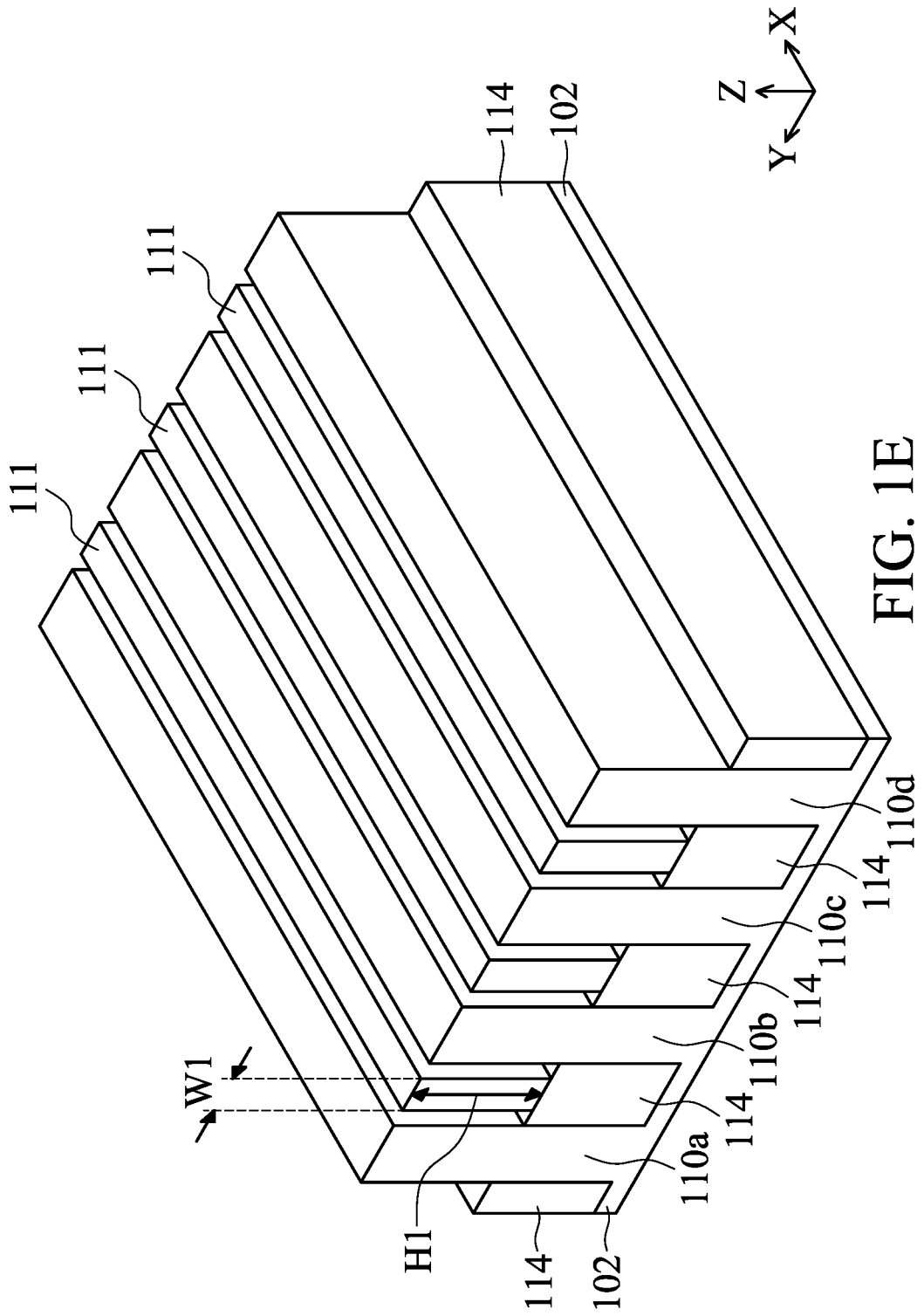

After the isolation structure 114 is formed, fin isolation structures 111 are formed over the isolation structure 114, as shown in FIG. 1E in accordance with some embodiments. Each of the fin isolation structures 111 has a strip shape that is similar to the shape of each of the fin structures 103. Therefore, the fin isolation structures 111 may be referred to as dummy fin structures or hybrid fin structures, and the fin structures 110a, 110b, 110c, and 110d may be referred to as active fin structures.

The fin isolation structures 111 are separated from the substrate 102 by the isolation structure 114 and extend along a direction that is substantially parallel to the longitudinal direction of the fin structures 110a, 110b, 110c, and 110d. In some embodiments, the top surface of the fin isolation structures 111 is substantially level with the top surface of the fin structures 110a, 110b, 110c, and 110d. In some embodiments, the patterned dielectric layer 105 and the patterned mask layer 107 are not removed, and the distance between the top surface of the patterned mask layer 107 to the top surface of the isolation structure 114 is substantially the same as the distance between the top surface and the bottom surface of the fin isolation structures 111 (i.e. the height H1 of the fin isolation structures 111).

In some embodiments, the width W1 of the fin isolation structures 111 is about 10 nm to about 50 nm, and the height H1 of the fin isolation structures 111 is about 5 nm to about 40 nm. As such, the fin isolation structures 111 may provide proper insulation for the subsequently formed epitaxial structures (for example, shown in FIG. 1G). However, the present disclosure is not limited thereto. In some embodiments, the fin isolation structures 111 may be omitted.

In some embodiments, some of the fin isolation structures 111 serve as portions of insulating gate-cut structures and are made of a nitride-based material, such as silicon nitride, silicon oxynitride, or silicon carbon nitride, or the like. In some embodiments, each of the fin isolation structures 111 includes a single-layered structure. In some other embodiments, each of the fin isolation structures 111 includes a double-layered structure, which is made of two layers having different materials. In some embodiments, the fin isolation structures 111 are made of a high-k dielectric material, such as metal oxide. Examples of high-k dielectric materials include hafnium oxide (HfO2), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the fin isolation structures 111 are formed by a chemical vapor deposition (CVD) process, a physical vapor deposition process (PVD), an atomic layer deposition (ALD) process, or another applicable process.

Figure 1F:
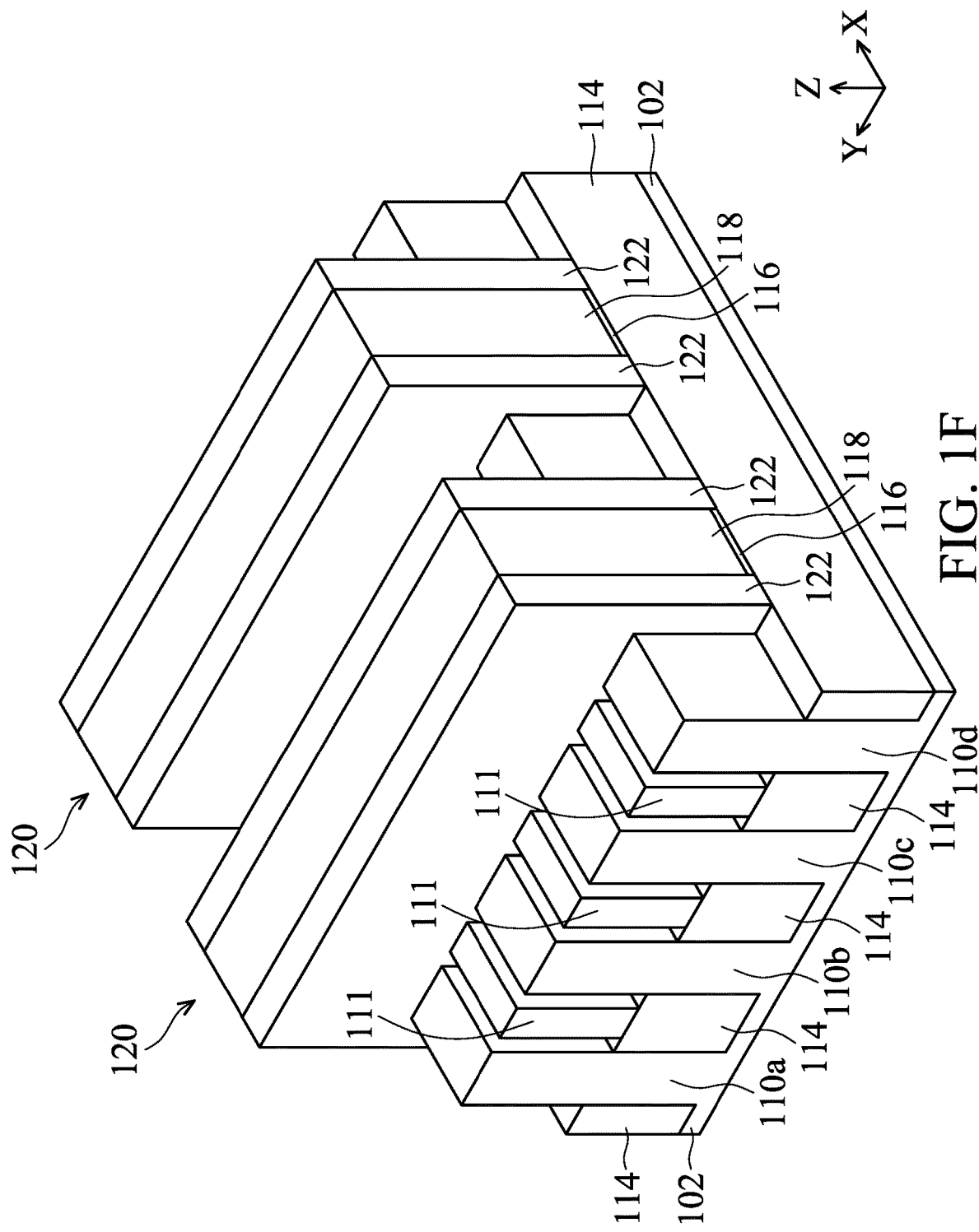

After the fin isolation structures 111 are formed, dummy gate structures 120 are formed across the fin structures 110*a*, 110*b*, 110*c*, and 110*d*, the fin isolation structures 111, and extend over the isolation structure 114, as shown in FIG. 1F in accordance with some embodiments. In some embodiments, each of the dummy gate structures 120 includes a dummy gate dielectric layer 116 and a dummy gate electrode layer 118 formed over the dummy gate dielectric layer 116. After the dummy gate structures 120 are formed, gate spacers 122 are formed on opposite sidewalls of each of the dummy gate structures 120. Each of the gate spacers 122 may be a single layer or multiple layers.

In order to improve the speed of the FinFET device structure, the gate spacers 122 are made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

In some other embodiments, the gate spacers 122 are made of an extreme low-k (ELK) dielectric material with a dielectric constant (k-value) less than about 2.5. In some embodiments, the ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

In addition, in some embodiments, the gate spacers 122 include air gaps (not shown) to further reduce their k value, such that the capacitances between the gate structures (formed subsequently) and the contacts (formed subsequently) electrically connected to the epitaxial structure (formed subsequently) may be reduced.

Figure 1G:
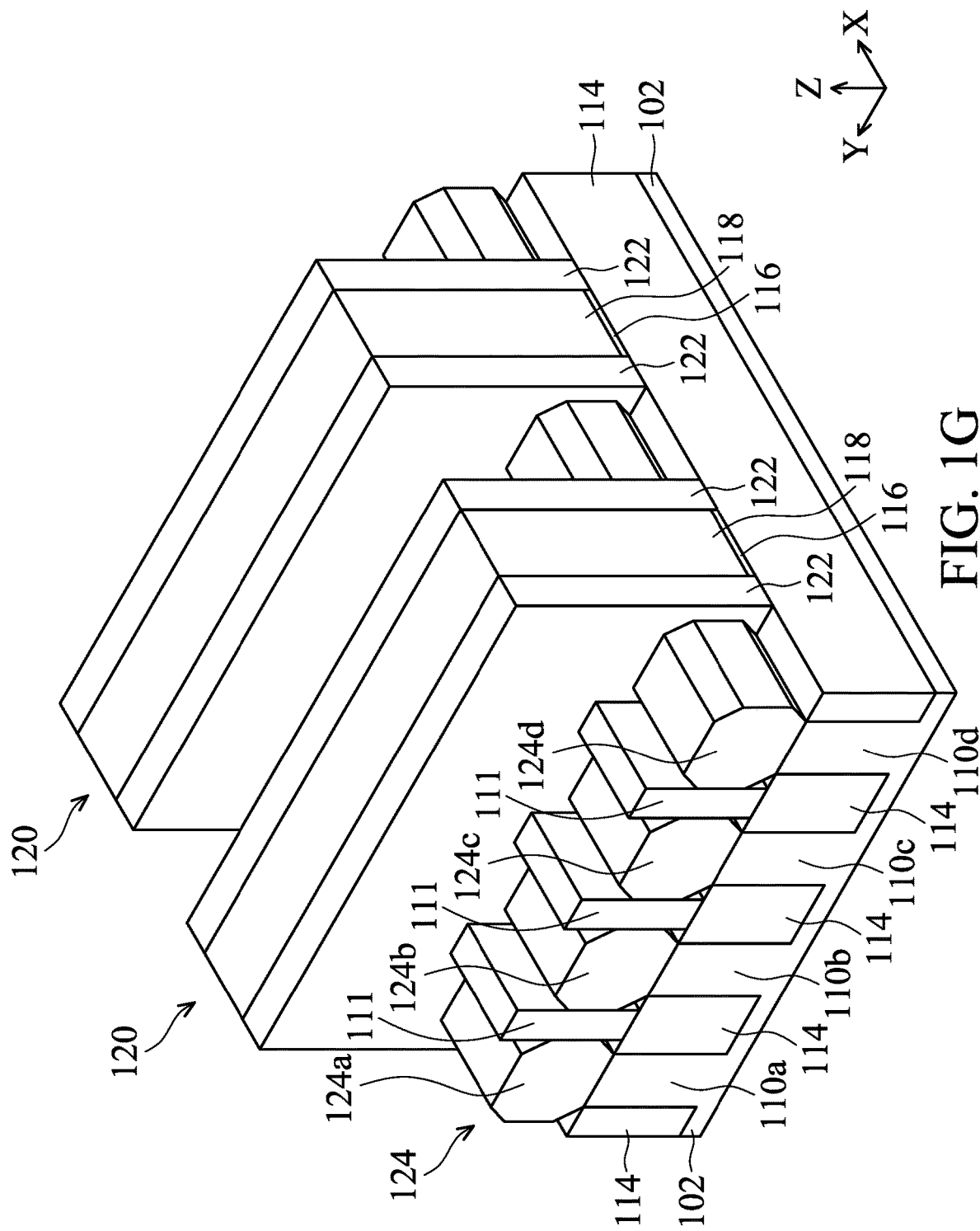

Afterwards, epitaxial structures are formed over the fin structures 110*a*, 110*b*, 110*c*, and 110*d*, as shown in FIG. 1G in accordance with some embodiments. In some embodiments, a first epitaxial structure 124*a* is formed over the first fin structure 110*a*, a second epitaxial structure 124*b* is formed over the second fin structure 110*b*, a third epitaxial structure 124*c* is formed over the third fin structure 110*c*, and a fourth epitaxial structure 124*d* is formed over the fourth fin structure 110*d*. For the sake of simplicity, the first epitaxial structure 124*a*, the second epitaxial structure 124*b*, the third epitaxial structure 124*c*, and the fourth epitaxial structure 124*d* may be collectively referred to as the epitaxial structures 124.

In some embodiments, the epitaxial structures 124 contact and are separated by the fin isolation structures 111. In some embodiments, the top surface of the fin isolation structures 111 is higher than top surfaces of the epitaxial structures 124. In some embodiments, the epitaxial structures 124 include different types of epitaxial structures. For example, the first epitaxial structure 124*a* and the fourth epitaxial structure 124*d* are the same type of epitaxial structure, and the second epitaxial structure 124*b* and the third epitaxial structure 124*c* are another type of epitaxial structure that is different from the type of the first epitaxial structure 124*a* and the fourth epitaxial structure 124*d*. However, the configuration of the epitaxial structures 124 merely serves as an example, those skilled in the art would modify the types or shapes of the epitaxial structures 124 based on the present application.

In some embodiments, portions of the fin structure 110 adjacent to the dummy gate structures 120 are recessed to form recesses at two sides of the fin structure 110, and a strained material is grown in the recesses by an epitaxial (epi) process to form the epitaxial structures 124. In addition, the lattice constant of the strained material may be different from the lattice constant of the substrate 102. In some embodiments, the epitaxial structures 124 include Ge, SiGe, InAs, InGaAs, InSb, GaAs, GaSb, InAlP, InP, or the like.

After the epitaxial structures 124 are formed, a contact etch stop layer (CESL) 126 is formed over the substrate 102, and an inter-layer dielectric (ILD) layer 128 is formed over the CESL 126. More specifically, the CESL 126 is formed over the epitaxial structures 124, the fin isolation structures 111, and the sidewalls of the gate spacers 122. In some embodiments, the CESL 126 is made of silicon nitride, silicon oxynitride, and/or other applicable materials. Moreover, the CESL 126 may be formed by plasma enhanced CVD, low-pressure CVD, atomic layer deposition (ALD), or other applicable processes.

In some embodiments, the ILD layer 128 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of the low-k dielectric materials include, but are not limited to, fluorinated silica glass (FSG), carbon doped silicon oxide, amorphous fluorinated carbon, parylene, bis-benzocyclobutenes (BCB), or polyimide. In addition, the ILD layer 128 may be formed by chemical vapor deposition (CVD), physical vapor deposition, (PVD), atomic layer deposition (ALD), spin-on coating, or another applicable process.

Figure 1H:
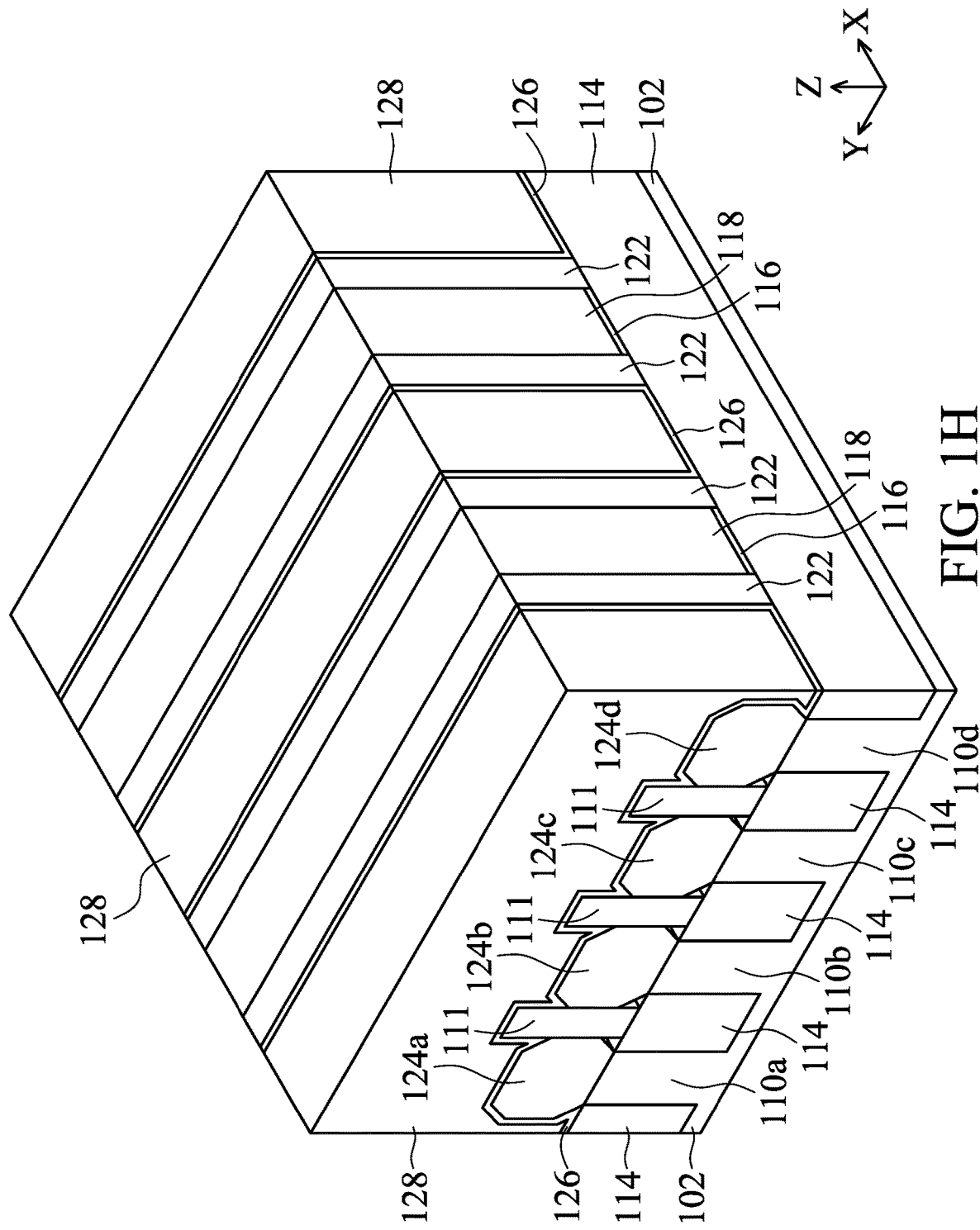

Afterwards, a planarizing process is performed on the ILD layer 128 until the top surfaces of the dummy gate structures 120 are exposed, as shown in FIG. 1H in accordance with some embodiments. After the planarizing process, the top surfaces of the dummy gate structures 120 may be substantially level with the top surfaces of the gate spacers 122 and the ILD layer 128. In some embodiments, the planarizing process includes a grinding process, a chemical mechanical polishing (CMP) process, an etching process, another applicable process, or a combination thereof.

Figure 1I:
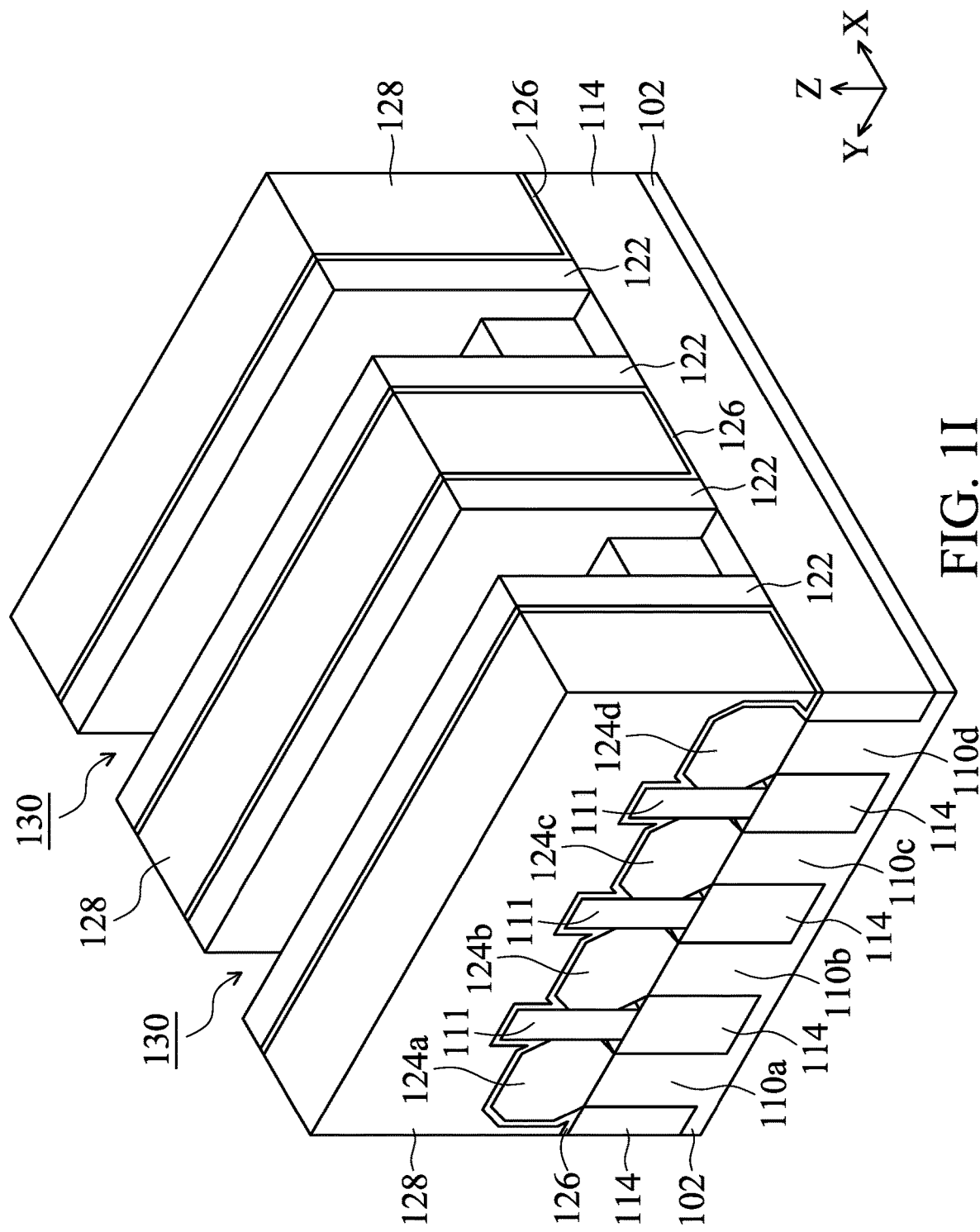

Next, the dummy gate structures 120 are removed to form trenches 130 in the ILD layer 128, as shown in FIG. 1I in accordance with some embodiments. More specifically, each of the trenches 130 is formed between each pair of the gate spacers 122, and the fin structure 110 is exposed by the trenches 130. The dummy gate dielectric layer 116 and the dummy gate electrode layer 118 are removed by an etching process, such as a dry etching process or a wet etching process.

Figure 1J:
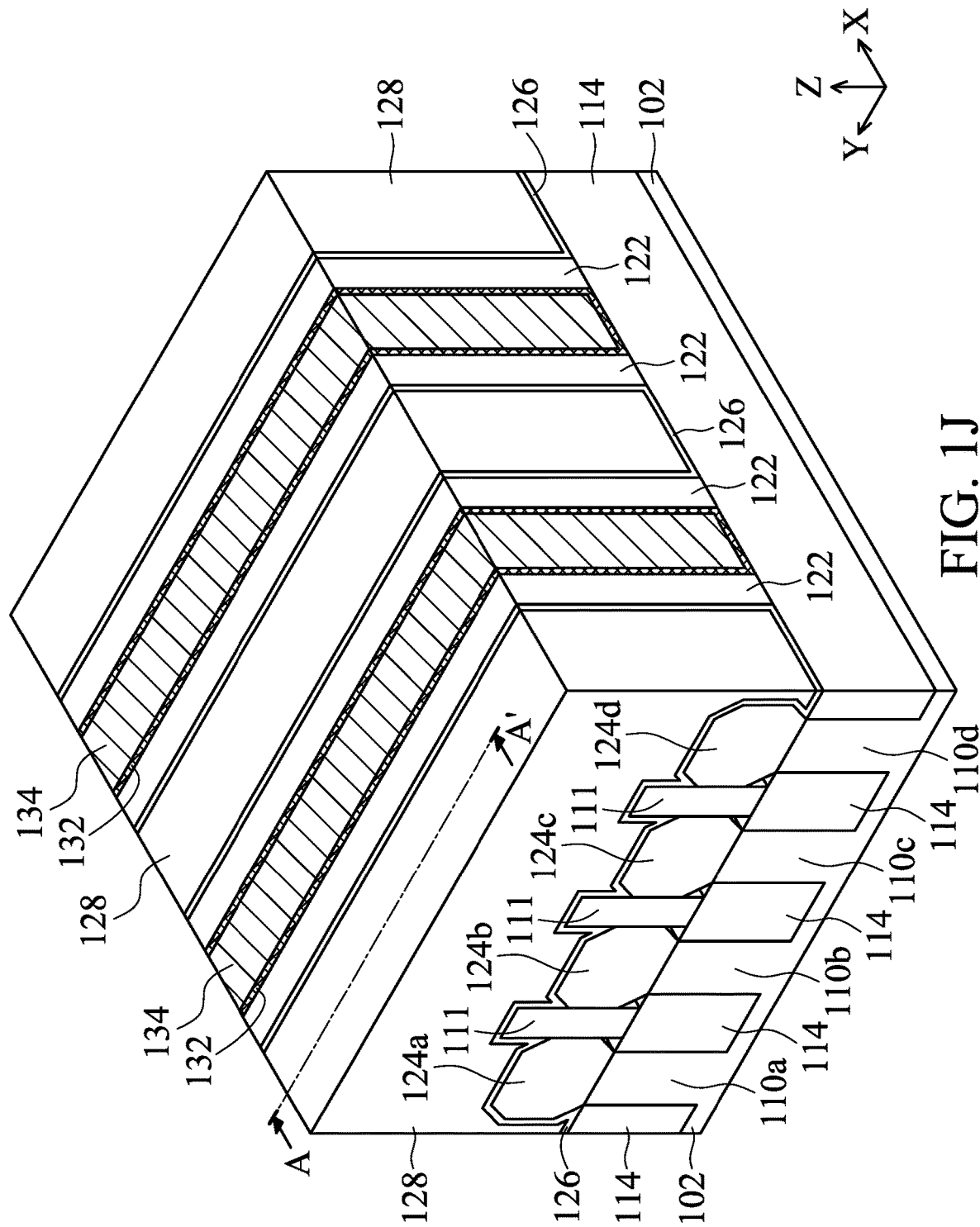

After the trenches 130 are formed, gate dielectric layers 132 and gate electrode layers 134 (which may be collectively referred to as a gate structure) are formed in the trenches 130, as shown in FIG. 1J in accordance with some embodiments. More specifically, the gate electrode layers 134 are formed over the gate dielectric layers 132, and sidewalls of the gate electrode layers 132 may be covered by the gate dielectric layers 132. In addition, the gate structure may also include work function layers (not shown) formed between each of the gate dielectric layers 132 and each of the gate electrode layers 134.

Each of the gate dielectric layers 132 may be a single layer or multiple layers. In some embodiments, the gate dielectric layers 132 are made of silicon oxide, silicon nitride, silicon oxynitride (SiON), dielectric material(s) with high dielectric constant (high-k), or a combination thereof. In some embodiments, the gate dielectric layers 132 are deposited using a plasma enhanced chemical vapor deposition (PECVD) process or a spin coating process.

Moreover, the gate electrode layers 134 are made of a conductive material such as aluminum (Al), copper (Cu), tungsten (W), titanium (Ti), tantalum (Ta), or another applicable material, in accordance with some embodiments. The gate electrode layers 134 may be formed by a deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, or a plasma enhanced CVD (PECVD) process.

The work function layers may be made of metal materials, and the metal materials may include N-work-function metal or P-work-function metal. The N-work-function metal may include tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal may include titanium nitride (TiN), tungsten nitride (WN), tantalum nitride (TaN), ruthenium (Ru) or a combination thereof.

Figure 2A:
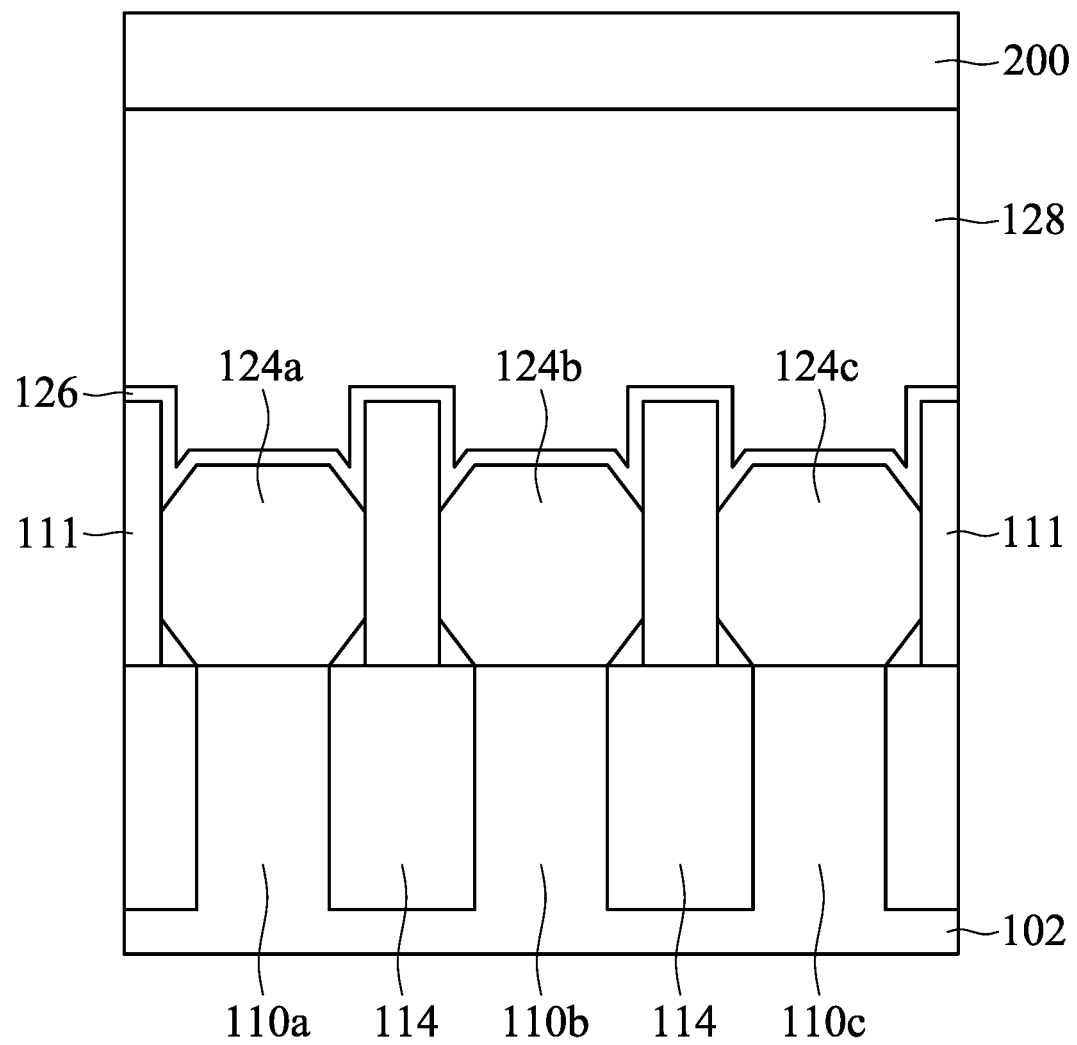
FIGS. 2A-2I are cross-sectional views illustrating various stages of forming the semiconductor structure in accordance with some embodiments.

FIGS. 2A-2I are cross-sectional views illustrating various stages of forming the semiconductor structure in accordance with some embodiments. It should be noted that FIGS. 2A-2I are illustrated along the line A-A' shown in FIG. 1J and the process shown in FIG. 2A continue from the process shown in the FIG. 1J. A mask layer 200 is formed on the ILD layer 128, as shown in FIG. 2A in accordance with some embodiments. In some embodiments, the mask layer 200 is formed by deposition processes, which may include a chemical vapor deposition (CVD) process, a high-density plasma chemical vapor deposition (HDPCVD) process, a spin-on process, a sputtering process, or another applicable process. In some embodiments, the mask layer 200 is provided for an isolation process of the gate structure (such as the gate dielectric layers 132 and gate electrode layers 134 in FIG. 1J). To be more specific, a portion of the gate structure that is uncovered by the mask layer 200 may be etched and filled with isolation material. Otherwise, the covered gate structure is not removed.

Figure 2B:
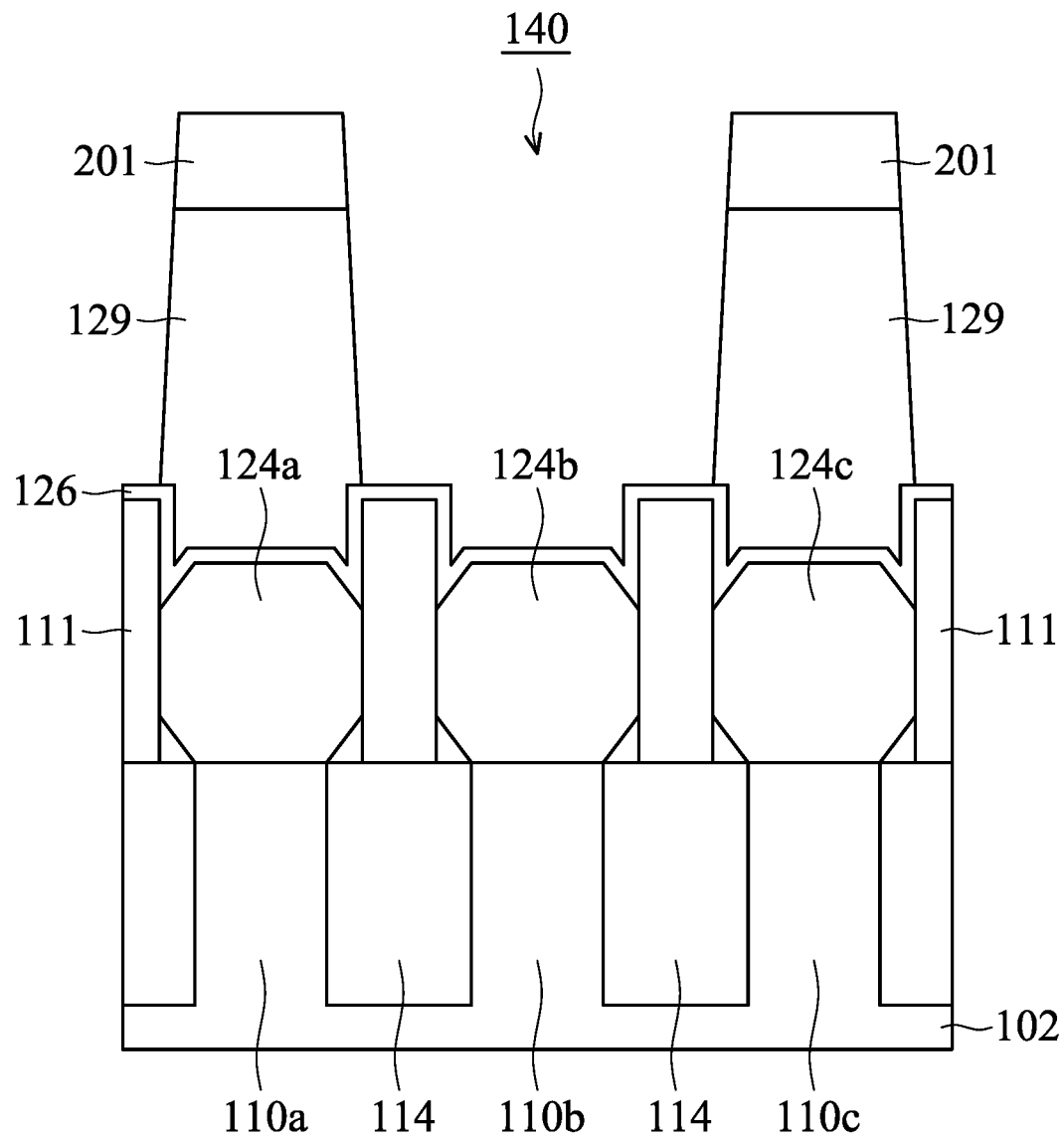

Next, an etching process is performed to obtain a patterned mask layer 201 and a patterned ILD layer 129, as shown in FIG. 2B in accordance with some embodiments. The etching process may be a dry etching process or a wet etching process. In some embodiments, the etching process is an anisotropic etching process. After the etching process is complete, a first opening 140 is formed in the patterned ILD layer 129 and over the second fin structure 110b and the second epitaxial structure 124b. In some embodiments, the first opening 140 penetrates the patterned ILD layer 129 and exposes the CESL 126. In some embodiments, a bottom of the first opening 140 is directly above the second epitaxial structure 124b and the top surface of one of the fin isolation structures 111. That is, the bottom of the first opening 140 overlaps with the second epitaxial structure 124b and the top surface of the fin isolation structure 111 in a top view.

Figure 2C:
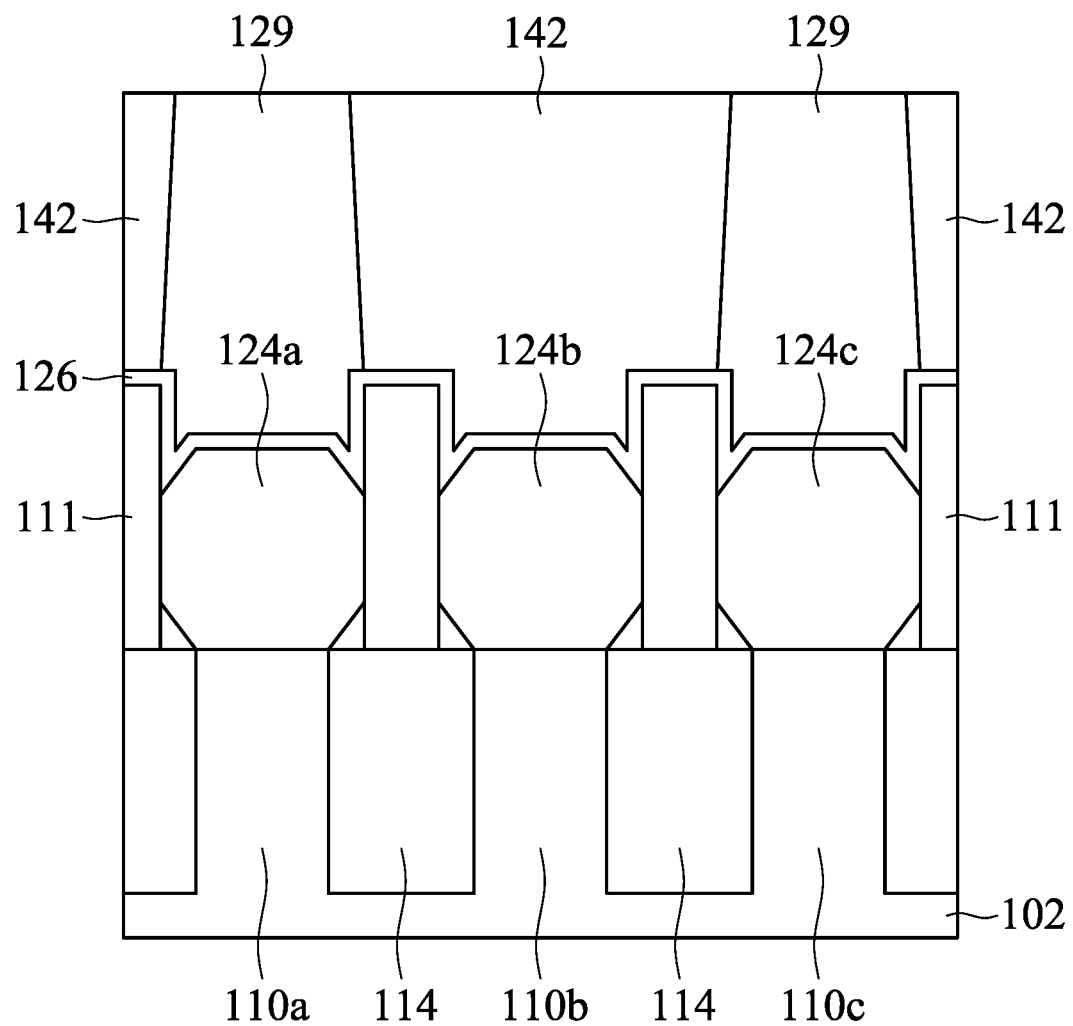

Afterwards, the patterned mask layer 201 is removed, as shown in FIG. 2C in accordance with some embodiments. In some embodiments, a dielectric material 142 is formed in the first opening 140 and around the patterned ILD layer 129. For example, the material of the dielectric material 142 may include SiC, LaO, AlO, AON, ZrO, HfO, SiN, Si, ZnO, ZrN, ZrAlO, TiO, TaO, YO, TaCN, ZrSi, SiOCN, SiOC, SiCN, HfSi, or a combination thereof. In some embodiments, the dielectric material 142 is made of dielectric material(s) with high dielectric constant (high-k). In some embodiments, the dielectric material 142 is deposited using a plasma enhanced chemical vapor deposition (PECVD) process, a spin coating process, any other suitable method, or a combination thereof. Optionally, a planarization process may be performed so that the top surface of the dielectric material 142 may be level with the top surface of the patterned ILD layer 129.

Figure 2D:
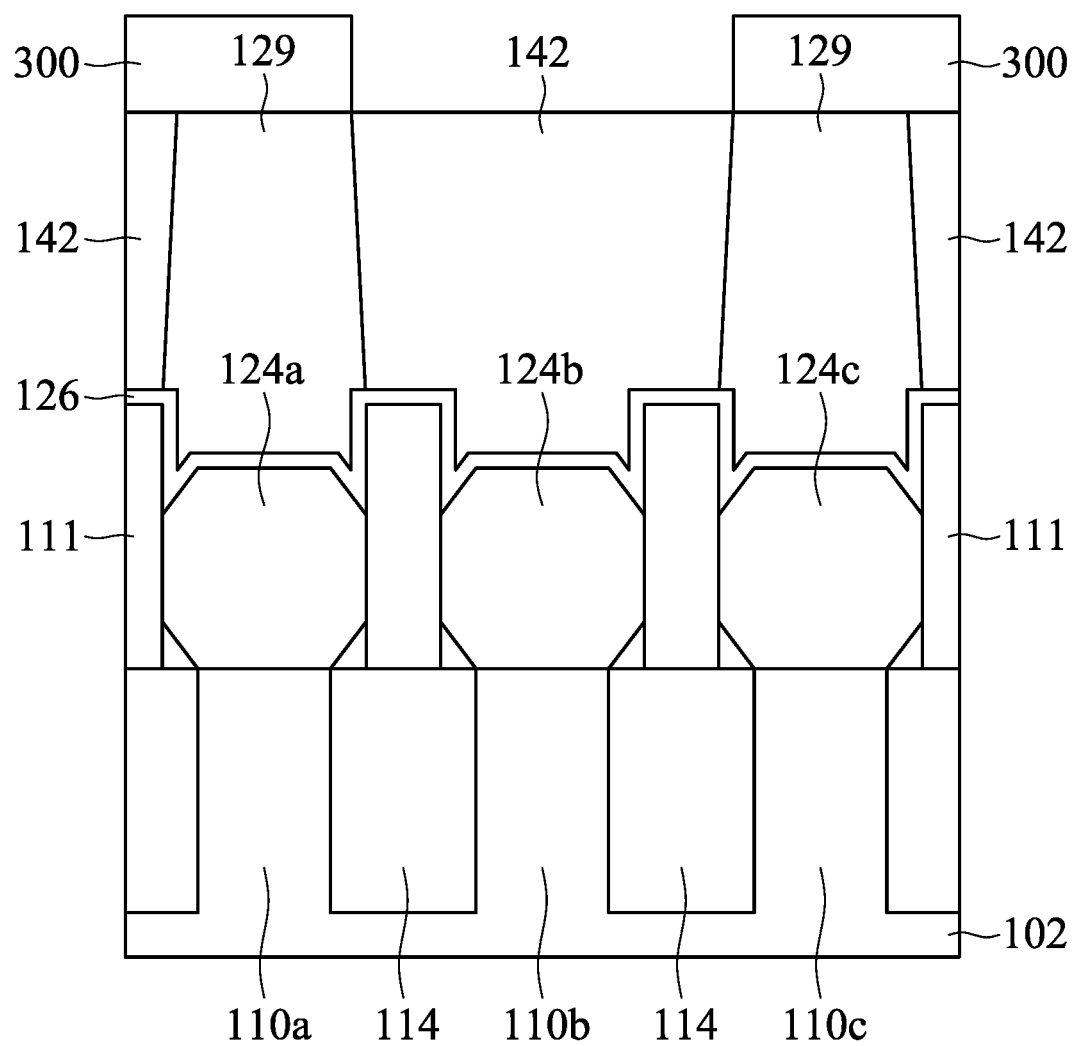

Next, a photoresist layer 300 is formed on the patterned ILD layer 129, and the photoresist layer 300 exposes the dielectric material 142 in the first opening 140, as shown in FIG. 2D in accordance with some embodiments. The photoresist layer 300 may be formed by a deposition process and a patterning process. The deposition process for forming the photoresist layer 300 may include a chemical vapor deposition (CVD) process, a high-density plasma chemical vapor deposition (HDPCVD) process, a spin-on process, a sputtering process, or another applicable process. The patterning process for forming the photoresist layer 300 may include a photolithography process and an etching process. The photolithography process may include photoresist coating (e.g., spin-on coating), soft baking, mask aligning, exposure, post-exposure baking, developing the photoresist, rinsing, and drying (e.g., hard baking). The etching process may include a dry etching process or a wet etching process.

Figure 2E:
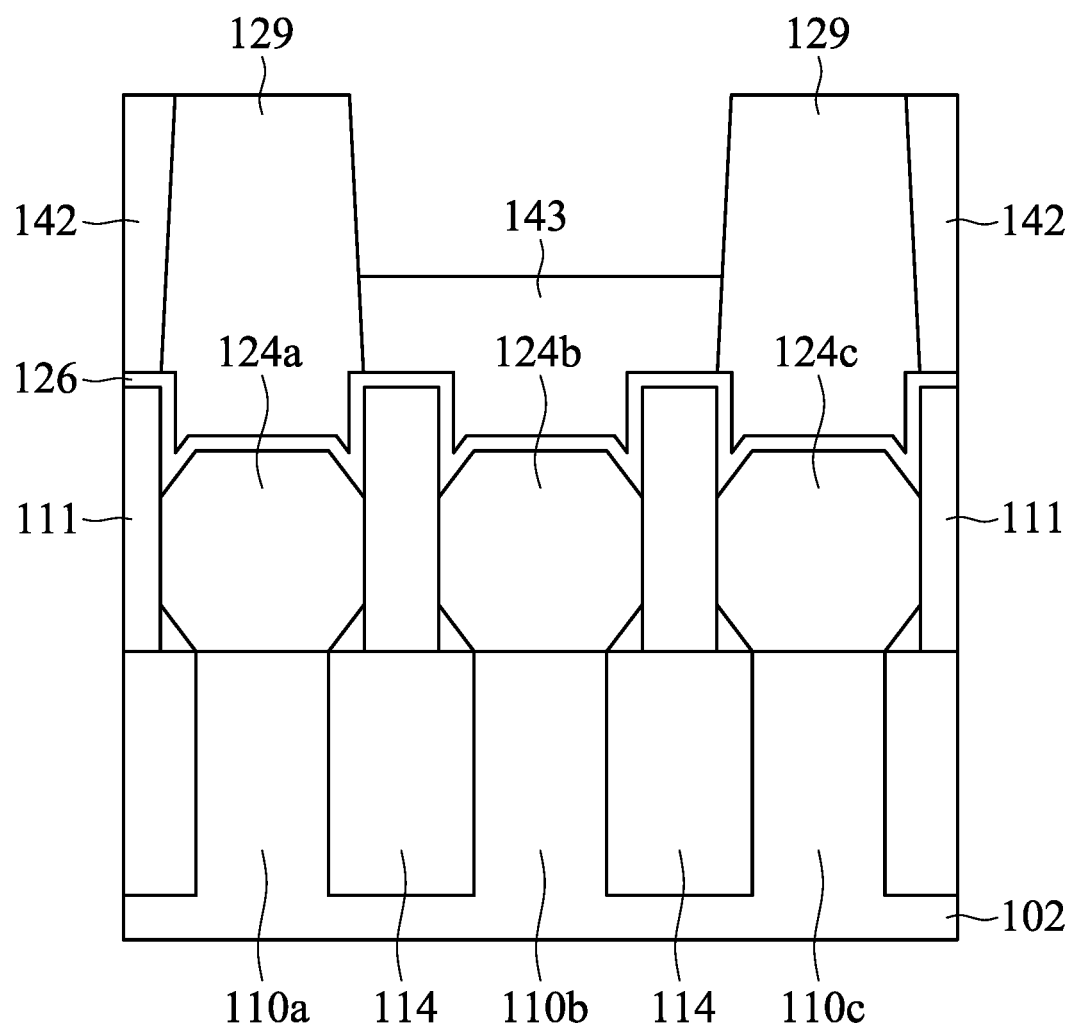

After the photoresist layer 300 is formed, the exposed dielectric material 142 in the first opening 140 is partially removed using an etching process, as shown in FIG. 2E in accordance with some embodiments. As a result, a recessed dielectric material 143 is obtained, and the photoresist layer 300 is removed. The etching process may include a dry etching process or a wet etching process. In some embodiments, the top surface of the recessed dielectric material 143 is lower than the top surface of the patterned ILD layer 129. In some embodiments, the top surface of the recessed dielectric material 143 is lower than the top surface of the dielectric material 142 outside the first opening 140 (i.e. covered by the photoresist layer 300).

Figure 2F:
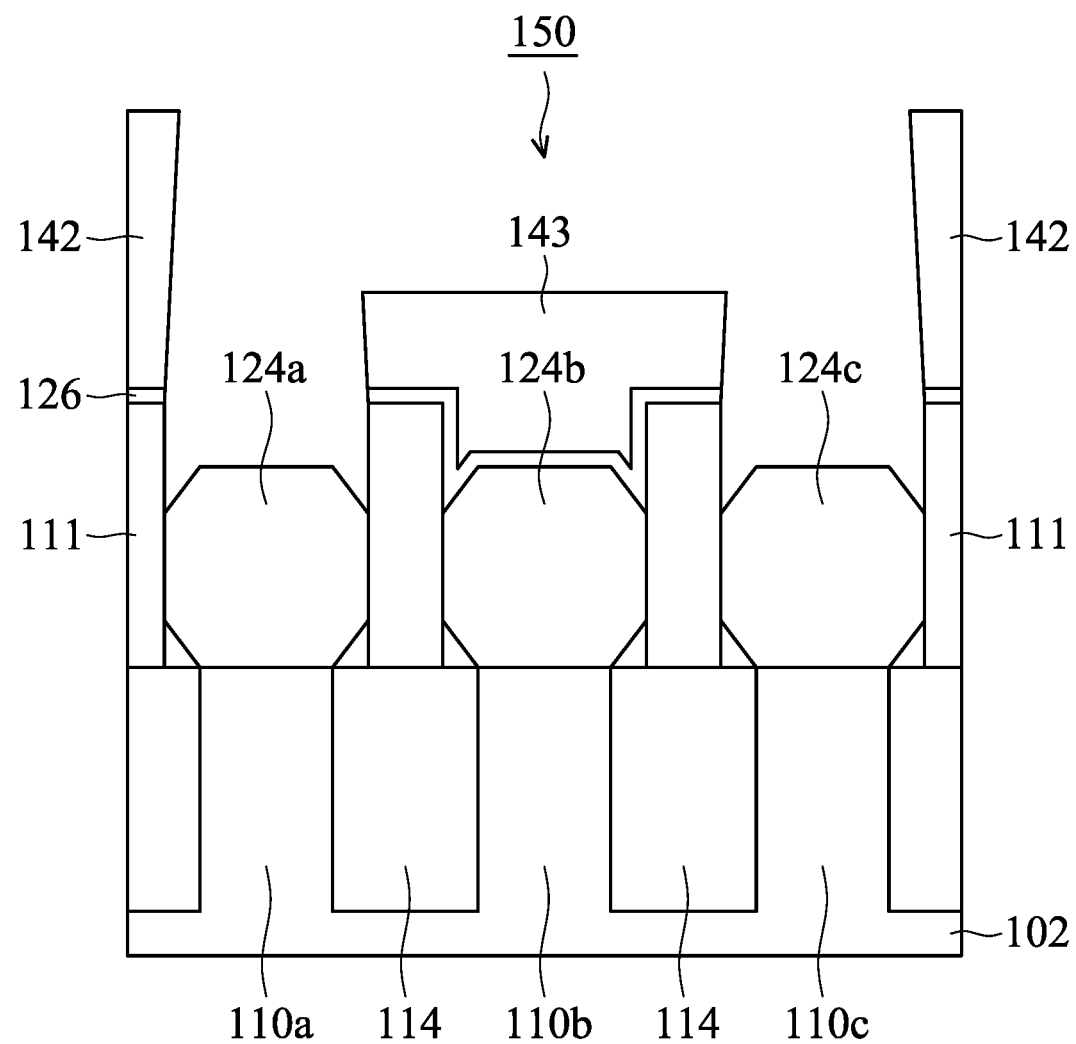

Then, the patterned ILD layer 129 that is adjacent to the recessed dielectric material 143 is removed by an etching process, as shown in FIG. 2F in accordance with some embodiments. Since the material of the recessed dielectric material 143 (and the dielectric material 142) is different from the material of the patterned ILD layer 129, the etch rate of the recessed dielectric material 143 is also different from the etch rate of the patterned ILD layer 129. In some embodiments, the etch rate of the recessed dielectric material 143 is substantially slower than the etch rate of the patterned ILD layer 129. Accordingly, all or most of the patterned ILD layer 129 is removed, while the recessed dielectric material 143 nearly remains its profile before the etching process performed.

In some embodiments, the CESL 126 serves as an etch stop layer of this etching process, and a portion of the CESL 126 located directly below the patterned ILD layer 129 is also removed, forming a second opening 150 for a contact 166 that is subsequently formed. The top surfaces of the first epitaxial structure 124a and the third epitaxial structure 124c are exposed in the second opening 150, and the second epitaxial structure 124b is covered and insulated by the recessed dielectric material 143. In some embodiments, the etching process may include a dry etching process or a wet etching process.

Figure 2G:
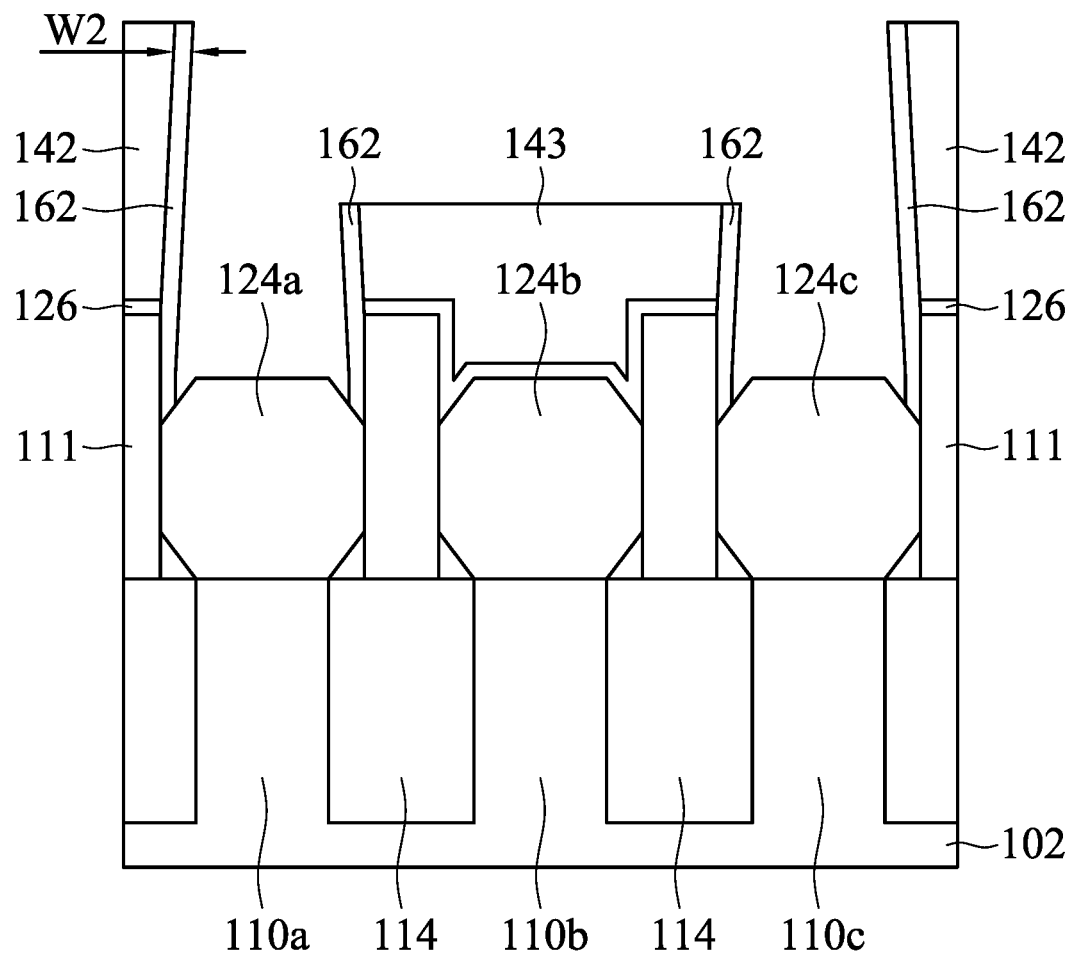

Next, a liner 162 is formed in the second opening 150 along the sidewalls of the dielectric material 142 and the sidewalls of the recessed dielectric material 143, as shown in FIG. 2G in accordance with some embodiments. In some embodiments, the material of the liner 162 includes SiC, LaO, AlO, AON, ZrO, HfO, SiN, Si, ZnO, ZrN, ZrAlO, TiO, TaO, YO, TaCN, ZrSi, SiOCN, SiOC, SiCN, HfSi, or a combination thereof. In some embodiments, the liner 162 extends onto the top surface of the first epitaxial structure 124a along a sidewall of one of the fin insulation structures 111. In some embodiments, the liner 162 ends at the top surface of one of the fin insulation structures 111 before reaching the top surface of the first epitaxial structure 124a.

It should be appreciated that the liner 162 may also extend onto the top surface of the third epitaxial structure 124c along a sidewall of one of the fin insulation structures 111, or end at the top surface of one of the fin insulation structures 111 before reaching the top surface of the third epitaxial structure 124c. Any possible configuration of the liner 162 is within the scope of the present disclosure. In some embodiments, the liner 162 is conformally formed along the sidewalls of the dielectric material 142 and the sidewalls of the recessed dielectric material 143. The width W2 of the liner 162 is about 1 nm to about 20 nm. Accordingly, it would leave enough space in the second opening 150 to form the contact 166 without increasing the difficulty of forming the liner 162.

Figure 2H:
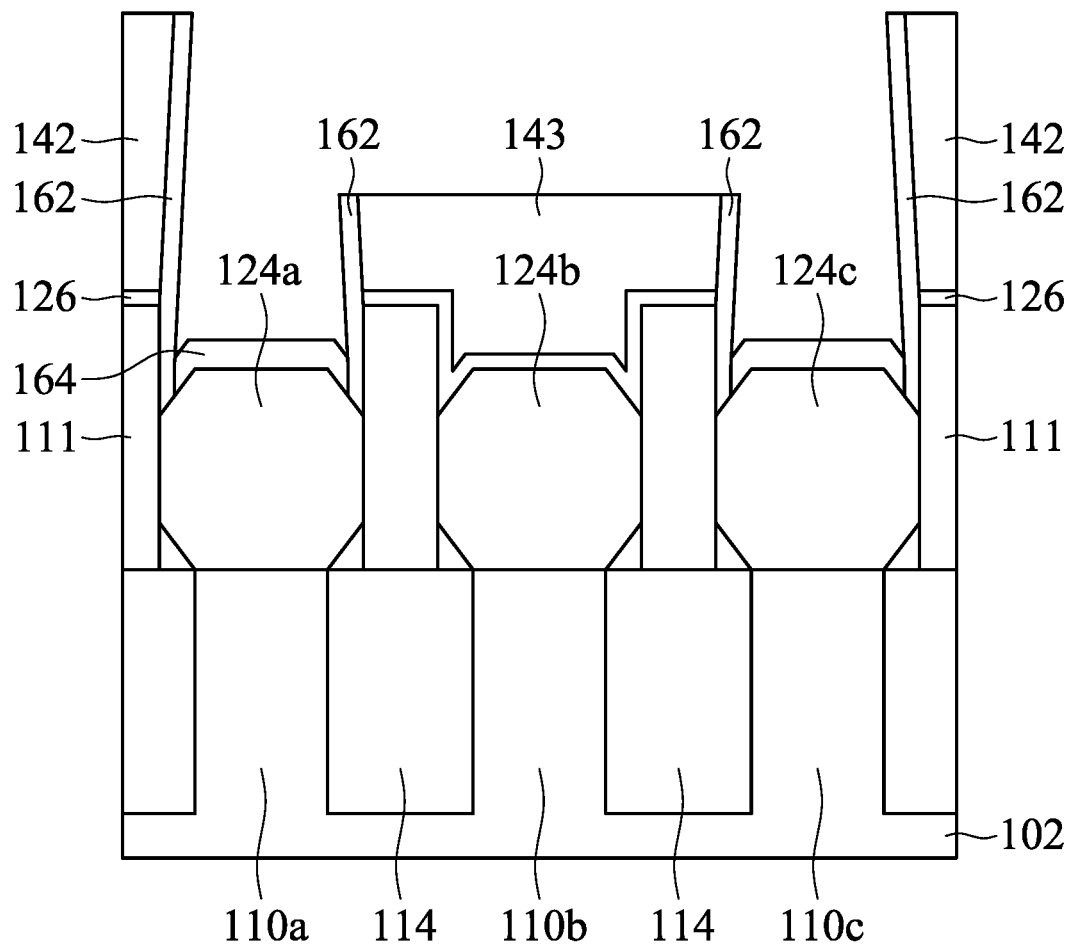

Then, a silicide layer 164 is formed on the first epitaxial structure 124a and the third epitaxial structure 124c in the second opening 150 using a silicidation process, as shown in FIG. 2H in accordance with some embodiments. For example, the silicide layer 164 may be formed in a portion of the first epitaxial structure 124a and the third epitaxial structure 124c. In some embodiments, the silicidation process includes a metal material deposition process and an annealing process performed in sequence. In some embodiments, the deposition process of the silicidation process includes a physical vapor deposition (PVD) process, an atomic layer deposition (ALD) process, or another applicable process. In some embodiments, the annealing process of the silicidation process is performed at a temperature of about 300° C. to about 800° C. After the annealing process, the unreacted metal material is removed. In some embodiments, the silicide layer 164 is conformally formed and therefore a thickness of the silicide layer 164 is substantially uniform across the silicide layer 164. In some embodiments, the top surface of the silicide layer 164 is lower than the top surface of the fin insolation structures 111.

In some embodiments, the silicide layer 164 is formed of one or more of cobalt silicide (e.g. CoSi, CoSi$_2$, Co$_2$Si, Co$_2$Si, Co$_3$Si; collectively "Co silicide"), titanium silicide (e.g. Ti$_5$Si$_3$, TiSi, TiSi$_2$, TiSi$_3$, Ti$_6$Si$_4$; collectively "Ti silicide"), nickel silicide (e.g. Ni$_3$Si, Ni$_{31}$Si$_{12}$, Ni$_2$Si, Ni$_3$Si$_2$, NiSi, NiSi$_2$; collectively "Ni silicide"), copper silicide (e.g. Cu$_{17}$Si$_3$, Cu$_{56}$Si$_{11}$, Cu$_5$Si, Cu$_{33}$Si$_7$, Cu$_4$Si, Cu$_{19}$Si$_6$, Cu$_3$Si, Cu$_{87}$Si$_{13}$; collectively "Cu silicide"), tungsten silicide (W$_5$Si$_3$, WSi$_2$; collectively "W silicide"), and molybdenum silicide (Mo$_3$Si, Mo$_5$Si$_3$, MoSi$_2$; collectively "Mo silicide").

Figure 2I:
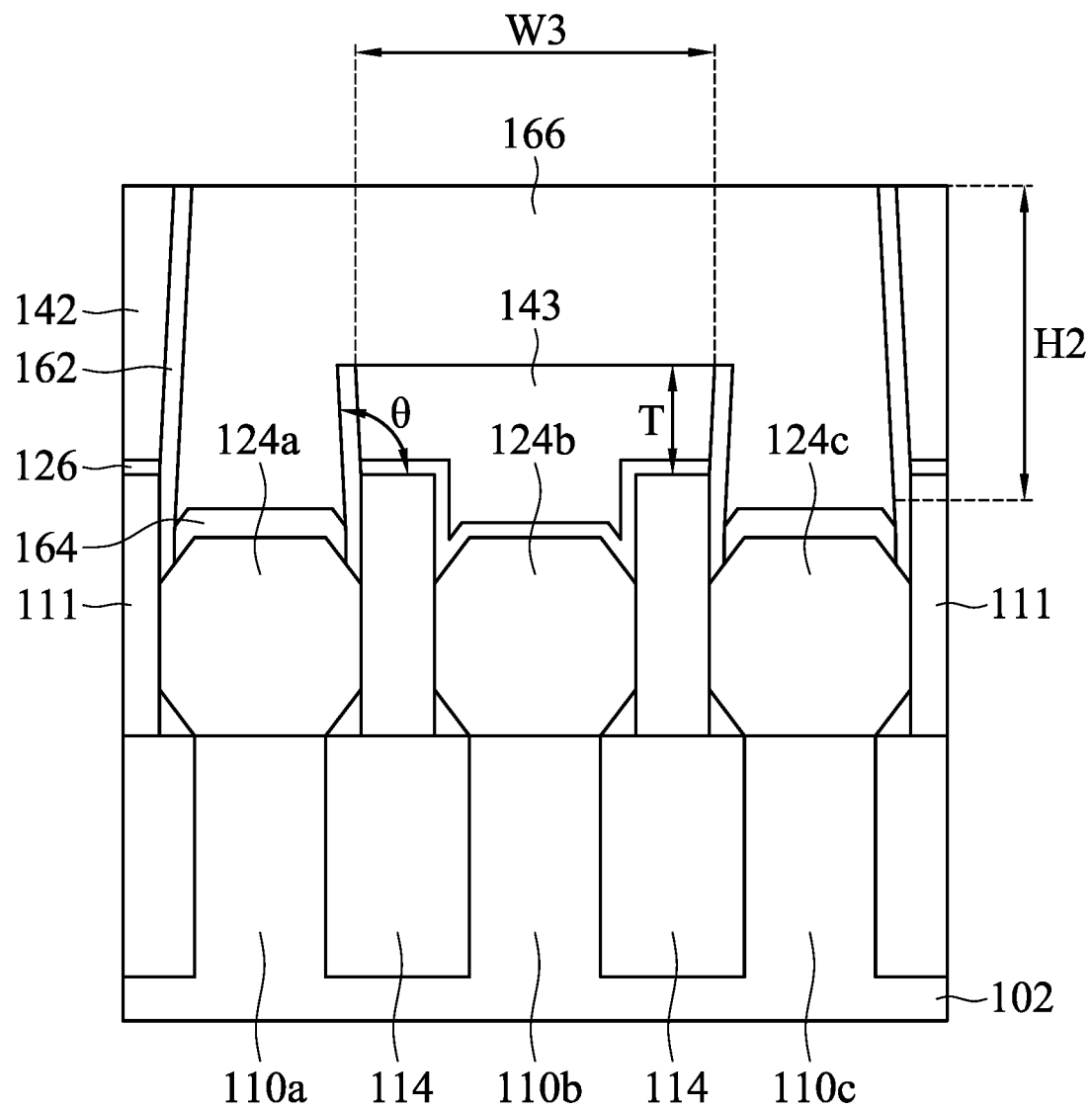

Afterwards, a contact 166 is filled into the second opening 150 and passes through the dielectric material 142, as shown in FIG. 2I in accordance with some embodiments. In some embodiments, the contact 166 is formed over and electrically connected to the first epitaxial structure 124a and the third epitaxial structure 124c. In some embodiments, the top surface of the contact 166 may be leveled with the top surface of the dielectric material 142. For example, the contact 166 may be surrounded by the dielectric material 142. Moreover, the contact 166 may be electrically connected to the first epitaxial structure 124a and the third epitaxial structure 124c through the silicide layer 164. Since the recessed dielectric material 143 is formed on the second epitaxial structure 124b, the contact 166 is electrically insulated from the second epitaxial structure 124b, and therefore the second epitaxial structure 124b may be referred to as "the dummy epitaxial structure."

In some embodiments, the thickness T of the recessed dielectric material 143 is about 2 nm to about 50 nm, wherein the thickness T may be measured from the top surface of the recessed dielectric material 143 to the top surface of the fin isolation structures 111. In some embodiments, the width W3 of the recessed dielectric material 143 is about 10 nm to about 100 nm, wherein the width W3 may be measured between the opposite sidewalls of the recessed dielectric material 143 between the first epitaxial structure 124a and the third epitaxial structure 124c. Accordingly, a stable insulation between the second epitaxial structure 124b and the contact 166 may be provided by the recessed dielectric material 143. Since the recessed dielectric material 143 is sandwiched between the second epitaxial structure 124b and the contact 166, the recessed dielectric material 143 may also be referred to as "the sandwiched portion" in the present disclosure.

In some embodiments, the contact 166 is in contact with the fin isolation structure 111. For example, the sidewall of the contact 166 intersects with the top surface of the fin isolation structure 111. An angle θ is formed between the top surface of the fin isolation structure 111 and the sidewall of the contact 166 via the recessed dielectric material 143. For example, the angle θ is an obtuse angle of about 90.5 degrees to about 110 degrees. As a result, the inclination between the top surface of the fin isolation structure 111 and the sidewall of the contact 166 would not increase the difficulty of the formation of the contact 166. In this way, the liner 162 and the contact 166 would fill the space between the fin isolation structures 111 over the first epitaxial structure 124a and/or the third epitaxial structure 124c, and the space is free from any dielectric material 142.

In some embodiments, the contact 166 is formed by deposition processes and a subsequent planarization process such as chemical mechanical polish (CMP). The contact 166 may be made of a conductive material, such as tungsten (W), cobalt (Co), ruthenium (Ru), copper (Cu), molybdenum (Mo), any other applicable material, or a combination thereof. In some embodiments, the contact 166 may be formed by any suitable deposition method, such as PVD, CVD, ALD, plating (e.g. electroplating). It should be appreciated that although one epitaxial structure (such as the second epitaxial structure 124b) is located below and insulated from the contact 166 in the present embodiment, it merely serves as an illustrative example. The number of the insulated epitaxial structure is not limited in the present application.

Figure 3:
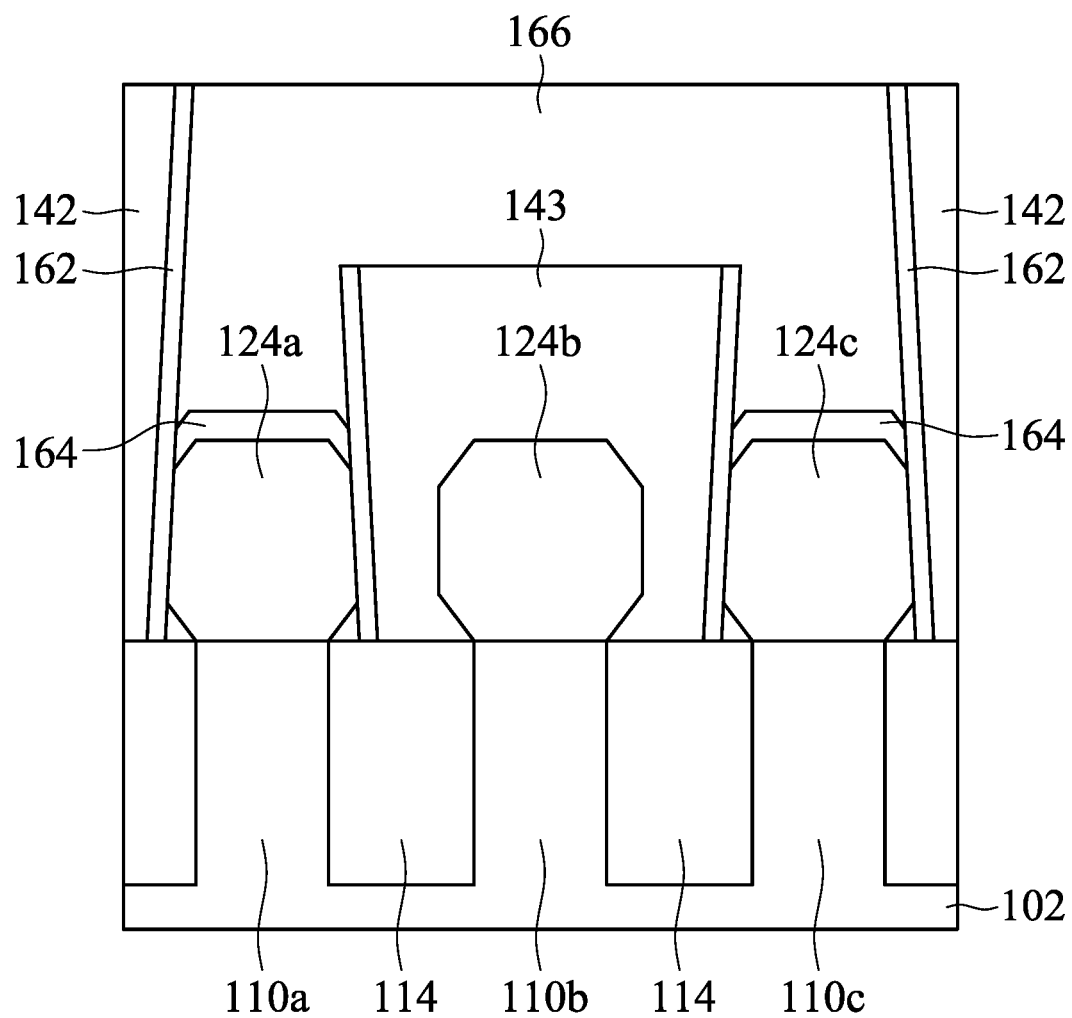
FIG. 3 is a cross-sectional view illustrating the semiconductor structure in accordance with some embodiments.

FIG. 3 is a cross-sectional view illustrating the semiconductor structure in accordance with some embodiments. It should be noted that the fin isolation structures 111 are omitted, as shown in FIG. 3 in accordance with some embodiments. The dielectric material 142 and the recessed dielectric material 143 are directly formed on the isolation structure 114, and surround the first epitaxial structure 124a, the second epitaxial structure 124b, and the third epitaxial structure 124c. In some embodiments, the liner 162 may extend onto the isolation structure 114 and the sidewall of the contact 166 ends at the top surface of the third epitaxial structure 124c. In some embodiments, the liner 162 and the contact 166 may extend onto the isolation structure 114 and located between the sidewalls of the first epitaxial structure 124a and the second epitaxial structure 124b. Since the fin isolation structures 111 are omitted, the number of steps for forming the semiconductor structure may be reduced and the overall process may be simplified.

Figure 4:
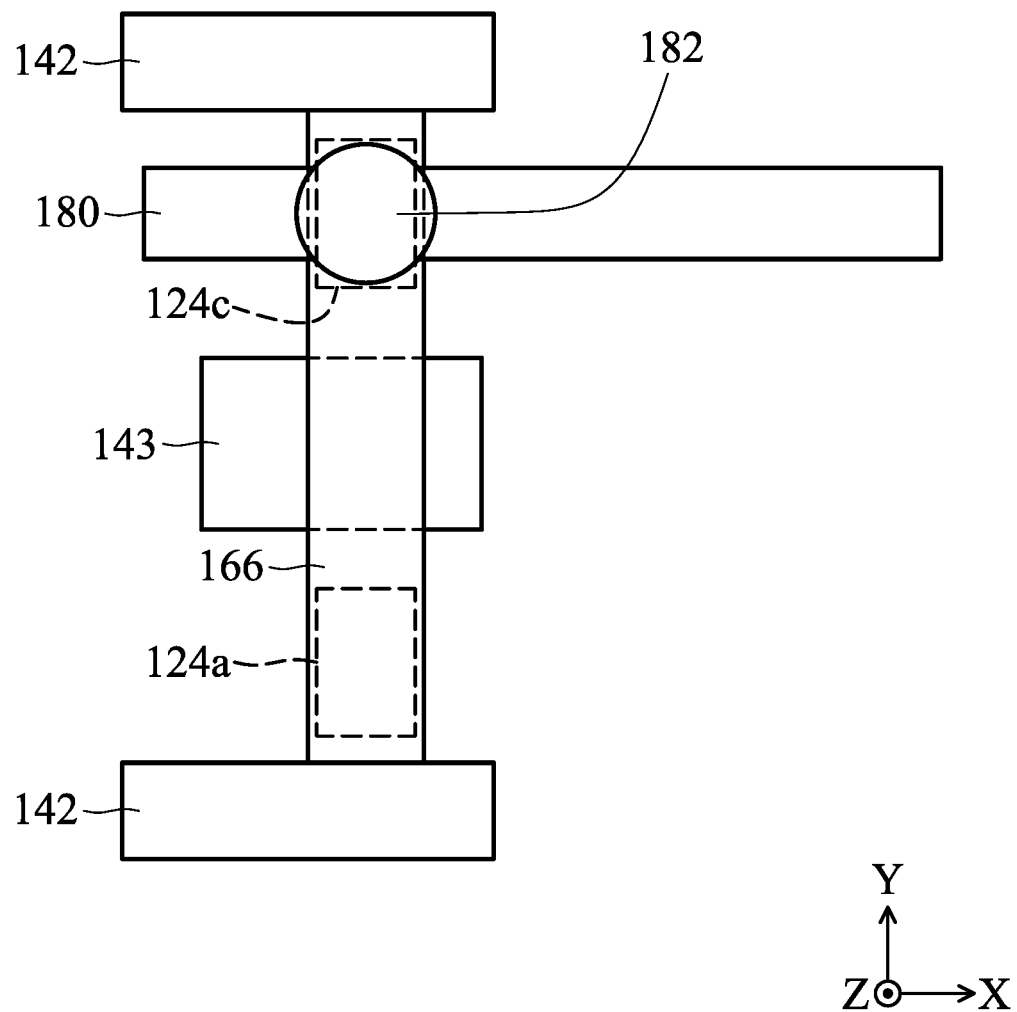
FIG. 4 is a layout view illustrating the semiconductor structure in accordance with some embodiments.

FIG. 4 is a layout view illustrating the semiconductor structure in accordance with some embodiments. It should be noted that a conductive layer 180 and a conductive via 182 are formed over the contact 166 and configured to transmit signal form/to the first epitaxial structure 124a and the third epitaxial structure 124c, as shown in FIG. 4 in accordance with some embodiments. For example, the conductive via 182 is formed in a dielectric layer between the conductive layer 180 and the contact 166. In some embodiments, the contact 166 is electrically connected to the first epitaxial structure 124a and the third epitaxial structure 124c, simultaneously. As a result, the single conductive layer 180 may be electrically connected to the two epitaxial structures 124a and 124c via the conductive via 182 and the contact 166. Therefore, the overall conductive structure may be simplified, reducing the cost and complexity of the manufacturing process.

As described above, the present disclosure is directed to semiconductor structures and methods for forming the same are provided. The semiconductor structure may include a contact formed in the single layer and connected to the non-adjacent epitaxial structures. Accordingly, it is more likely to achieve miniaturization (for example, reducing cell height), and increase the routing flexibility. Moreover, the high-k dielectric material is adopted to secure the isolation between the contact and the dummy epitaxial structure.

In accordance with some embodiments, a semiconductor structure includes: a first fin structure, a second fin structure, and a third fin structure over a substrate, wherein the second fin structure is located between the first fin structure and the third fin structure. The semiconductor structure also includes a fin isolation structure formed between the first fin structure and the third fin structure; and a gate structure formed over the first fin structure, the second fin structure, the third fin structure and the fin isolation structure. The semiconductor structure further includes a first epitaxial structure formed over the first fin structure; a second epitaxial structure formed over the second fin structure; and a third epitaxial structure formed over the third fin structure. In addition the semiconductor structure includes: a dielectric material over the first epitaxial structure, the second epitaxial structure, and the third epitaxial structure; and a contact formed in the dielectric material and connected to the first epitaxial structure and the third epitaxial structure.

In accordance with some embodiments, a semiconductor structure includes: a plurality of fin structures over a substrate; and a gate structure formed over the fin structures. The semiconductor structure further includes a plurality of epitaxial structures formed over the fin structures. The semiconductor structure also includes a dielectric material over the epitaxial structures; and a contact formed in the dielectric layer, wherein the contact is located directly over and insulated from one of the epitaxial structures.

In accordance with some embodiments, a method of forming a semiconductor structure includes: forming a first fin structure, a second fin structure and a third fin structure over a substrate, wherein the second fin structure is located between the first fin structure and the third fin structure. The method includes forming a fin isolation structure among the first fin structure, the second fin structure, and the third fin structure. The method also includes forming a gate structure over the first fin structure, the second fin structure, the third fin structure, and the isolation structure. The methods includes forming a first epitaxial structure over the first fin structure; forming a second epitaxial structure over the second fin structure; and forming a third epitaxial structure over the third fin structure. In addition, the method includes forming an interlayer dielectric layer over the first epitaxial structure, the second epitaxial structure, and the third epitaxial structure; and forming a first opening by etching the interlayer dielectric layer. The method includes filling a dielectric material into the first opening; and forming a second opening by etching the dielectric material and the interlayer dielectric layer, wherein the second opening exposes the first epitaxial structure and the third epitaxial structure. The method includes filling a conductive material into the second opening to form a contact, wherein the contact is connected to the first epitaxial structure and the third epitaxial structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first fin structure, a second fin structure, and a third fin structure over a substrate, wherein the second fin structure is located between the first fin structure and the third fin structure;
a fin isolation structure formed between the first fin structure and the third fin structure;
a gate structure formed over the first fin structure, the second fin structure, the third fin structure and the fin isolation structure;
a first epitaxial structure formed over the first fin structure;
a second epitaxial structure formed over the second fin structure;
a third epitaxial structure formed over the third fin structure;
a dielectric material over the first epitaxial structure, the second epitaxial structure, and the third epitaxial structure; and
a contact formed in the dielectric material and connected to the first epitaxial structure and the third epitaxial structure, wherein the contact extends over the second epitaxial structures, a portion of the dielectric material is sandwiched between the second epitaxial structure and the contact, and a height of the sandwiched portion of the dielectric material is about 2 nm to about 50 nm.

2. The semiconductor structure as claimed in claim 1, wherein the contact is in contact with the fin isolation structure.

3. The semiconductor structure as claimed in claim 2, wherein a sidewall of the contact intersects with a top surface of the fin isolation structure.

4. The semiconductor structure as claimed in claim 3, wherein an obtuse angle is formed between the top surface of the fin isolation structure and the sidewall of the contact via the dielectric material.

5. The semiconductor structure as claimed in claim 4, wherein the obtuse angle is less than or equal to 110 degrees.

6. The semiconductor structure as claimed in claim 3, wherein the top surface of the fin isolation structure is higher than top surfaces of the epitaxial structures.

7. The semiconductor structure as claimed in claim 1, wherein a width of the sandwiched portion of the dielectric material is about 10 nm to about 100 nm.

8. The semiconductor structure as claimed in claim 1, further comprising an interlayer dielectric layer formed over the first epitaxial structure, the second epitaxial structure, and the third epitaxial structure, and a dielectric constant of the dielectric material is different from a dielectric constant of the interlayer dielectric layer.

9. A semiconductor structure, comprising:
a plurality of fin structures over a substrate;
a gate structure formed over the fin structures;
a plurality of epitaxial structures formed over the fin structures;
a dielectric material over the epitaxial structures; and
a contact formed in the dielectric layer, wherein the contact is located directly over and insulated from one of the epitaxial structures, a portion of the dielectric material is sandwiched between the one of epitaxial structure and the contact, and a width of the sandwiched portion of the dielectric material is about 10 nm to about 100 nm.

10. The semiconductor structure as claimed in claim 9, wherein the contact is connected to two of the epitaxial structures.

11. The semiconductor structure as claimed in claim 10, wherein the two epitaxial structures are different types.

12. The semiconductor structure as claimed in claim 10, further comprising a silicide layer formed between the contact and the two epitaxial structures.

13. The semiconductor structure as claimed in claim 12, further comprising a fin isolation structure formed between the fin structures, wherein a top surface of the silicide layer is lower than the top surface of the fin isolation structure.

14. The semiconductor structure as claimed in claim 9, wherein a height of the sandwiched portion of the dielectric material is about 2 nm to about 50 nm.

15. A method of forming a semiconductor structure, comprising:

forming a first fin structure, a second fin structure and a third fin structure over a substrate, wherein the second fin structure is located between the first fin structure and the third fin structure;

forming a fin isolation structure among the first fin structure, the second fin structure, and the third fin structure;

forming a gate structure over the first fin structure, the second fin structure, the third fin structure, and the isolation structure;

forming a first epitaxial structure over the first fin structure;

forming a second epitaxial structure over the second fin structure;

forming a third epitaxial structure over the third fin structure;

forming an interlayer dielectric layer over the first epitaxial structure, the second epitaxial structure, and the third epitaxial structure;

forming a first opening by etching the interlayer dielectric layer;

filling a dielectric material into the first opening;

forming a second opening by etching the dielectric material and the interlayer dielectric layer, wherein the second opening exposes the first epitaxial structure and the third epitaxial structure; and filling a conductive material into the second opening to form a contact, wherein the contact is connected to the first epitaxial structure and the third epitaxial structure and in contact with the fin isolation structure, wherein a sidewall of the contact intersects with a top surface of the fin isolation structure, and the top surface of the fin isolation structure is higher than top surfaces of the epitaxial structures.

16. The method as claimed in claim 15, wherein forming the second opening comprises etching the dielectric material and the interlayer dielectric layer using different etching processes.

17. The method as claimed in claim 15, wherein the first opening overlaps the second epitaxial structure, and the second epitaxial structure is spaced apart from the second opening.

18. The method as claimed in claim 15, further comprising forming a liner along a sidewall of the dielectric material.

19. The method as claimed in claim 18, further comprising:
forming a silicide layer over the first epitaxial structure and the third epitaxial structure after forming the liner.

20. The method as claimed in claim 15, wherein a height of the sandwiched portion of the dielectric material is about 2 nm to about 50 nm.

* * * * *